United States Patent
Matsuo

(10) Patent No.: US 7,498,661 B2
(45) Date of Patent: Mar. 3, 2009

(54) MANUFACTURING METHOD FOR SEMICONDUCTOR DEVICE, SEMICONDUCTOR DEVICE, AND ELECTRONIC APPARATUS

(75) Inventor: Yoshihide Matsuo, Chino (JP)

(73) Assignee: Seiko Epson Corporation (JP)

( * ) Notice: Subject to any disclaimer, the term of this patent is extended or adjusted under 35 U.S.C. 154(b) by 71 days.

(21) Appl. No.: 11/442,897

(22) Filed: May 30, 2006

(65) Prior Publication Data

US 2006/0214302 A1  Sep. 28, 2006

Related U.S. Application Data

(62) Division of application No. 10/774,362, filed on Feb. 6, 2004, now Pat. No. 7,129,112.

(30) Foreign Application Priority Data

Mar. 25, 2003   (JP)   ............................. 2003-082965

(51) Int. Cl.
   *H01L 29/40*   (2006.01)
(52) U.S. Cl. .................. 257/621; 257/678; 257/698; 257/700; 257/735
(58) Field of Classification Search ................ 257/621, 257/777, 678, 698, 700, 735
   See application file for complete search history.

(56) References Cited

U.S. PATENT DOCUMENTS

| | | | |
|---|---|---|---|
| 5,025,295 A | 6/1991 | Kuesters et al. | |
| 5,423,941 A * | 6/1995 | Komura et al. | 438/700 |
| 5,501,893 A | 3/1996 | Laermer et al. | |
| 5,521,125 A | 5/1996 | Ormond et al. | |
| 5,723,941 A | 3/1998 | Roelevink | |
| 6,088,236 A | 7/2000 | Tomura et al. | |
| 6,664,129 B2 | 12/2003 | Siniaguine | |
| 6,706,546 B2 | 3/2004 | Yoshimura et al. | |
| 6,794,272 B2 | 9/2004 | Turner et al. | |

(Continued)

FOREIGN PATENT DOCUMENTS

JP   6-283537   10/1994

(Continued)

OTHER PUBLICATIONS

Communication (with translation) from Chinese Patent Office re: related application.

*Primary Examiner*—M. Wilczewski
*Assistant Examiner*—Telly D Green
(74) *Attorney, Agent, or Firm*—Harness, Dickey & Pierce, P.L.C.

(57) ABSTRACT

A manufacturing method for a semiconductor device includes a hole portion formation step for forming hole portions whose entire width is substantially identical to the width of the opening portion in a part of the active surface side of the substrate on which electronic components are formed, a curved surface formation step for curving the bottom surface of the hole portion while maintaining the width of the bottom surface in the hole portions substantially identical to the width of the opening portion, a connecting terminal formation step for forming connecting terminals that serve as the external electrodes of the electronic circuits by burying metal in the hole portions, and an exposure step for exposing a part of the connecting terminals by carrying out processing on the back surface of the substrate.

4 Claims, 19 Drawing Sheets

U.S. PATENT DOCUMENTS

| | | | | |
|---|---|---|---|---|
| 6,882,030 | B2* | 4/2005 | Siniaguine | 257/621 |
| 2002/0084513 | A1* | 7/2002 | Siniaguine | 257/621 |
| 2003/0183914 | A1* | 10/2003 | Wallace | 257/678 |

FOREIGN PATENT DOCUMENTS

| | | |
|---|---|---|
| JP | 7-142492 | 6/1995 |
| JP | 8-213427 | 8/1996 |
| JP | 2001-044197 | 2/2001 |
| JP | 2001-053218 | 2/2001 |
| JP | 2001-339011 | 12/2001 |
| JP | 2002-093776 | 3/2002 |
| JP | 2004-200547 | 7/2004 |

* cited by examiner

MANUFACTURING METHOD FOR SEMICONDUCTOR DEVICE, SEMICONDUCTOR DEVICE, AND ELECTRONIC APPARATUS

CROSS REFERENCE TO RELATED APPLICATIONS

This application is a divisional patent application of U.S. Ser. No. 10/774,362 filed Feb. 6, 2004, claiming priority to Japanese Patent Application No. 2003-082965 filed Mar. 25, 2003, which is incorporated herein by reference.

BACKGROUND OF THE INVENTION

1. Field of the Invention

The present invention relates to a manufacturing method for a semiconductor device, to a semiconductor device made thereby, and to an electronic apparatus provided with the semiconductor device.

2. Description of Related Art

Presently, due to the implementation of downsizing and weight reduction in portable electronic apparatus such as notebook computers, PDAs (Personal Data Assistants) and the like, and devices such as sensors, micromachines, and heads for printers, research and development related to downsizing various types of electronic components such as the semiconductor chips provided therein is flourishing. In addition, in order to increase the added value, increasingly high functionality of these electronic apparatus is being planed, and increasingly high functionality and high speed are also required for the electronic components provided within these electronic apparatus.

System LSI (Large Scale Integration) is one example of an electronic component that has a high functionality, but time is required to commercialize system LSI. In the current situation, system LSI has failed to maintain the recent development cycle of electronic apparatus. Thus, SIP (System in Package) technology has been proposed. In SIP, various functions among the plurality of functions contained in system LSI are provided on one IC (Integrated Circuit), and these chips are combined to realize a system LSI in one package.

In SIP technology, this is implemented by stacking a plurality of ICs three-dimensionally, but in order for the stacked ICs to function as system LSI; each must be electrically connected to the other. Conventionally, the electrodes formed on each IC are electrically connected by using a wire bonding technology, but in connections by wire bonding, the wiring length becomes long, and thus there is a limit to downsizing the packaging.

Thus, a three-dimensional packaging technology has been proposed wherein ICs are thinned by carrying out an etching process or a grinding process on the bottom surface of the IC, and at the same time connecting terminals consisting of metals are formed that pass through the upper surface and the bottom surface of the IC, and the connecting portions formed on the stacked ICs are bonded, thereby providing electrical connection between the ICs. Refer, for example, to Japanese Patent Application Laid-Open (JP-A) No. 2001-44197 for details of this three-dimensional packaging technology.

The electrical components manufactured by stacking chips using the three-dimensional packaging technology described above are sealed in a sealing resin, and thus it is possible to guarantee a certain degree of reliability. However, in the case that the electrical component is mounted in a portable electrical device, it is necessary to guarantee a higher strength because it can be anticipated that strong vibrations and shocks will be received from the outside.

In order to implement a further increase in the reliability of the electrical components, it is necessary to increase the bonding strength between the connecting terminals formed on each of the ICs. In the conventional electrical component fabricated using three-dimensional packaging technology, the distal ends (the part that bonds with the other chip) of the connecting terminals formed on the IC usually have a flat shape. Thus, the bonding between the connecting terminals of the stacked chips is two-dimensional, and there is the problem that the bonding strength is low, and thereby the reliability is low.

In consideration of the problem described above, it is an object of the present invention to provide a manufacturing method for a semiconductor device and a semiconductor device that can increase the bonding strength of the stacked semiconductor chips and thereby guarantee a high reliability, and an electronic apparatus equipped with this semiconductor device.

SUMMARY OF THE INVENTION

The first aspect of the present invention is a manufacturing method for a semiconductor device has a hole portion formation step for forming hole portions whose entire width is substantially identical to the width of the opening portion in a part of the active surface side of the substrate on which electronic components are formed, a curved surface formation step for curving the bottom surface of the hole portion while maintaining the width of the bottom surface in the hole portions substantially identical to the width of the opening portion, a connecting terminal formation step for forming connecting terminals that serve as the external electrodes of the electronic circuits by burying metal in the hole portions, and an exposure step for exposing a part of the connecting terminals by carrying out processing on the back surface of the substrate.

According to this aspect, hole portions whose entire width is substantially identical to the width of the opening are formed on a part of the active surface side of the substrate, a curved surface is formed on the bottom surface of the hole portions while the width of the bottom surface of the hole portion is maintained substantially identical to the width of the opening, a connecting terminal is formed by burying metal in a hole portion, processing of the back surface of the substrate is carried out to expose a part of a connecting terminal, and thereby the distal end of an exposed connecting terminal has imparted the shape of the curved surface that has been formed at the hole portion. Thereby, it is possible to increase the bonding strength during bonding by increasing the bonding surface area of this connecting terminal, and it is possible to guarantee a high reliability. In addition, when a curved surface has been imparted to the bottom surface, the width of the bottom surface is maintained substantially identical to the width of the opening, and thereby it is possible to use the present invention even in the case that the connecting terminals are arranged at a narrow pitch without the distal end of a connecting terminal becoming greatly larger than the width of the opening.

In addition, the manufacturing method for a semiconductor device according to the first aspect is characterized in that the curve forming step is a step in which an approximately semi-spherical curved surface is imparted to the bottom surface of the hole portion by isotropic etching.

According to this invention, because approximately semi-spherical curved surface is imparted to the bottom surface of the hole portion by isotropic etching, it is possible to make the bottom surface of the hole portion into a curved surface by adding only a simple step, without making the processing steps complicated.

In addition, the manufacturing method for a semiconductor device according to a first aspect of the present invention is characterized in that the exposure step is a step in which a part of a connecting terminal is exposed without changing the shape of the connecting terminal.

According to this invention, because a part of a connecting terminal is exposed without changing the shape of the connecting terminal, it is possible to obtain a high bonding strength during bonding without the surface area of the curved surface at the distal end of the connecting terminal decreasing due to the processing of the back side of the substrate.

In addition, the manufacturing method for a semiconductor device according to a first aspect of the present invention is characterized in including between the curved surface formation step and the connecting terminal formation step an insulating layer formation step that forms an insulating layer on the inner wall and the bottom surface of a hole portion, and an exposure step includes a first etching step in which the back surface of the substrate is etched until the thickness of the substrate is approximately slightly more thick than the buried depth of the connecting terminal, a second etching step in which the insulating layer formed inside a hole portion is exposed by etching the back surface of the substrate at a lower etching rate than the etching rate in the first etching step, and a third etching step in which a connecting terminal is exposed by etching at least a part of the exposed insulating layer.

According to this invention, because etching is carried out at a high etching rate in the first etching step and the etching is carried out at a low etching rate in the second etching step, it is possible to shorten the time necessary to etch the back surface of the substrate, and at the same, it is possible to adjust precisely the thickness of the thinned substrate and the amount of the projection of a connecting terminal from the back surface of the substrate. In addition, because the connecting terminal is formed after the insulating layer on the inner wall and bottom surface of the hole portion are formed, it is possible to prevent defects such as current leakage and the like.

In order to solve the problem described above, the manufacturing method for a semiconductor device according to a second aspect of the invention includes a concavo-convex shape formation step in which a concavo-convex shape is formed on a part of the active surface side of the substrate on which the electrical circuits are formed; a hole formation step in which the area on which the concavo-convex shape has been formed is etched, and a hole portion is formed whose entire width is substantially identical to the width of the area on which the concavo-convex shape has been formed and whose bottom surface shape is substantially identical to the concavo-convex shape; a connecting terminal formation step in which connecting terminals that serve as external electrodes for the electrical circuit are formed by burying metal in the hole portions; and an exposure step in which processing of the back surface of the substrate is carried out to expose a part of a connecting terminal.

According to this aspect, the distal end of an exposed connecting terminal has imparted thereto the concavo-convex shape that has been formed at the bottom surface of a hole portion because concavo-convex shape is formed on a part of the active surface side of the substrate, the area on which the concavo-convex shape has been formed is etched, and a hole portion is formed whose entire width is substantially identical to the width of the area on which the concavo-convex shape has been formed and whose bottom surface shape is substantially identical to the concavo-convex shape, the connecting terminals that serve as the external electrode of the electrical circuit are formed by burying metal in the hole portions, and processing of the back surface of the substrate is carried out to expose a part of the connecting terminals. Thereby, it is possible increase the bond strength during bonding by increasing the bonding surface area of the connecting terminals. In addition, because the width of a connecting terminal is substantially identical to the entire width at the area on which the concavo-convex shape is formed on the substrate surface, the invention can be used also in the case that the connecting terminals are arranged at a narrow pitch without the distal end of the connecting terminal becoming greatly larger than the width of the opening.

In addition, the manufacturing method for a semiconductor device according to a second aspect of the present invention is characterized in that the exposure step is a step in which a part of a connecting terminal is exposed without changing the shape of the connecting terminal.

According to this invention, because a part of a connecting terminal is exposed without changing the shape of the connecting terminal formed in the hole portion, a high bonding strength can be obtained during bonding without the area of the curved surface at the distal end of the connecting terminal being reduced due to the processing of the back surface of the substrate.

In addition, the manufacturing method for a semiconductor device according to the second aspect of the present invention is characterized in including between the hole formation step and the connecting terminal formation step an insulating layer formation step that forms an insulating layer on the inner wall and the bottom surface of the hole portion, and the exposure step includes a first etching step in which the back surface of the substrate is etched until the thickness of the substrate is approximately slightly more thick than the buried depth of the connecting terminal, a second etching step in which the insulating layer formed inside a hole portion is exposed by etching the back surface of the substrate at a lower etching rate than the etching rate in the first etching step, and a third etching step in which a connecting terminal is exposed by etching at least a part of the exposed insulating layer.

According to this invention, because etching is carried out at a high etching rate in the first etching step and the etching is carried out at a low etching rate in the second etching step, it is possible to shorten the time necessary to etch the back surface of the substrate, and at the same, it is possible to adjust precisely the thickness of the thinned substrate and the amount of the projection of the connecting terminal from the back surface of the substrate. In addition, because the connecting terminal is formed after the insulating layer on the inner wall and bottom surface of the hole portion are formed, it is possible to prevent such defects as current leakage and the like.

In order to solve the problems described above, the manufacturing method for a semiconductor device according to a third aspect of the present invention is characterized in including a mask formation step in which a mask is formed that has a plurality of holes at the hole formation area set on a part of the active surface side of the substrate on which the electric circuits are formed; a concavo-convex hole formation step in which hole portions are formed whose entire width is substantially identical to the width at the hole formation area and whose bottom surface has a concavo-convex shape by etching the substrate through each of the holes formed in the mask by using a etching method that produces a slight widening in the substrate surface direction; a connecting terminal formation step in which connecting terminals are formed that serve as external electrodes for the electrical circuit by burying metal in the hole portions; and an exposure step in which processing is carried out on the back surface of the substrate to expose a part of the connecting terminals.

According to this invention, the final hole portions are formed whose entire width is substantially identical to the hole formation area and whose bottom surface has imparted a concavo-convex shape by forming a mask that has a plurality of holes at the hole formation area that is set in a part of the active surface and by etching the substrate through each of the hole portions that have been formed in the mask so as to produce a slight widening in the substrate surface direction, connecting terminals are formed by burying metal in these hole portions, and carrying out processing on the back surface of the substrate to expose a part of the connecting terminals. Thereby, the distal ends of the exposed connecting terminals have imparted thereto the concavo-convex shape formed at the bottom surface of the hole portions. Thus, it is possible to increase the bonding strength during the bonding by increasing the bonding surface area of these connecting terminals, and it is possible to guarantee a high reliability. In addition, the entire width of a connecting terminal is substantially identical to the width at the hole formation area, and thereby the invention can be used even in the case that the connecting terminals are arranged at a narrow pitch without the distal end of a terminal becoming greatly larger than the width of the opening.

In addition, the manufacturing method for a semiconductor device according to the third aspect of the invention is characterized in that the exposure step is a step in which a part of a connecting terminal is exposed without changing the shape of the connecting terminal.

According to this invention, a part of a connecting terminal is exposed without changing the shape of the connecting terminal, and thereby it is possible to obtain a high bonding strength during bonding without the surface area of the curved surface at the distal end of the connecting terminal decreasing due to the processing of the back surface of the substrate.

In addition, the manufacturing method for a semiconductor device according to a third aspect of the present invention is characterized in including in including between the curved surface formation step and the connecting terminal formation step an insulating layer formation step that forms an insulating layer on the inner wall and the bottom surface of the hole portion, and an exposure step that includes a first etching step in which the back surface of the substrate is etched until the thickness of the substrate is approximately slightly more thick than the depth to which the connecting terminals are buried, a second etching step in which the insulating layer formed inside the hole portion is exposed by etching the back surface of the substrate at a lower etching rate than the etching rate in the first etching step, and a third etching step in which the connecting terminal is exposed by etching at least a part of the exposed insulating layer.

According to this invention, because etching is carried out at a high etching rate in the first etching step and the etching is carried out at a low etching rate in the second etching step, it is possible to shorten the time necessary to etch the back surface of the substrate, and at the same, it is possible to adjust precisely the thickness of the thinned substrate and the amount of the projection of the connecting terminal from the back surface of the substrate. In addition, because the connecting terminal is formed after the insulating layer on the inner wall and bottom surface of the hole portion is formed, it is possible to prevent such defects as current leak and the like.

In order to solve the problems described above, the manufacturing method for a semiconductor device according to a forth aspect of the present invention is characterized in including a dicing step in which the semiconductor device that is fabricated by any of the manufacturing methods for the semiconductor device described above is diced into individual semiconductor chips, a stacking step in which the same type of semiconductor chips or different types of semiconductor chips are stacked, and a terminal bonding step in which the connecting terminals formed on the stacked semiconductor chips are bonded together.

According to this invention, the semiconductor device, in which the shape of the distal end of a connecting terminal has a curved or concavo-convex shape, is diced into individual semiconductor chips, identical or different types of semiconductor chips are stacked, and the connecting terminals formed on the semiconductor chips are bonded together, and thereby it is possible to increase the bonding strength of the stacked semiconductor chips. As a result it is possible to fabricate a semiconductor device having a three-dimensional packaging structure that has a high reliability.

In order to solve the problem described above, the manufacturing method for a semiconductor device according to a fifth aspect of the present invention is characterized in including a dicing step in which the semiconductor device that is fabricated by any of the manufacturing methods for a semiconductor device described above is diced; a mounting step in which identical types of semiconductor chips or different types of semiconductor chips are mounted singly or in plurality on a substrate having a connection part formed thereon; and a bonding step in which the connecting terminals formed on the stacked semiconductor chips are bonded together, or the connecting portion and the connecting terminals are bonded together.

According to this invention, a semiconductor device, in which the shape of the distal end of a terminal has a curved or concavo-convex shape, is cut into individual semiconductor chips, identical types or different types of semiconductor chips are mounted on the mounting substrate, and the connecting terminals formed on the semiconductor chips formed on the semiconductor chips are bonded together, or the connecting terminals formed on the semiconductor chips and the connecting portion formed on the mounting substrate are bonded, and thereby it is possible to increase the bonding strength of the stacked semiconductor chips or the bonding strength between the semiconductor chips and the mounting substrate. As a result, it is possible to fabricate a semiconductor device in a three-dimensional packaging structure that has a high reliability.

The semiconductor device of the present invention is characterized in being fabricated by any of the manufacturing methods for a semiconductor device described above.

In addition, in order to solve the problem described above, the semiconductor device of the present invention is characterized in providing a thinned substrate having an active surface on which electric circuits are formed, and connecting terminals, which serve as the external electrodes for the electric circuits, formed by passing through the substrate from the active surface side to the back surface side, and the distal end of a connecting terminal on the back surface side of the substrate has a curved surface.

According to this invention, a connecting terminal is formed by passing through the substrate and the shape of the distal end of a terminal at the back surface side of the substrate is a curved surface, and thereby it is possible to increase the bonding surface area of the connecting terminal.

Here, in the semiconductor device of the present invention, the distal end of the connecting terminal is preferably an approximately semispherical curved surface or a concavo-convex shape.

In addition, the semiconductor device of the present invention is characterized in that any of the semiconductor devices described above are stacked in plurality and the connecting terminals are bonded together.

According to this invention, because the semiconductor devices are stacked in plurality and the connecting terminals having an increased bonding surface area are bonded together, it is possible to increase the bonding strength, and it is possible to increase the reliability of the three-dimensional packaging structure.

In addition, the semiconductor device of the present invention is characterized in providing a mounting substrate on which a connecting portion has been formed and has one or a plurality of any of the semiconductor devices described above mounted on the mounting substrate, and the connecting terminals are bonded together or the connecting portion and the connecting terminals are bonded.

According to this invention, the semiconductor devices are stacked in plurality on the mounting substrate and the connecting terminals having an increased bonding surface area are bonded together or the connecting terminals having the increased bonding surface area and the mounting substrate are bonded, and thereby it is possible to increase the bonding strength and it is possible to increase the reliability of the three-dimensional packaging structure.

The electronic apparatus of the present invention is characterized in being provided with any of the semiconductor devices described above.

DETAILED DESCRIPTION OF THE INVENTION

Below, the manufacturing method for a semiconductor device according to the embodiments of the present invention, the semiconductor device, and the electronic apparatus will be explained in detail with reference to the figures.

Figure 1A:
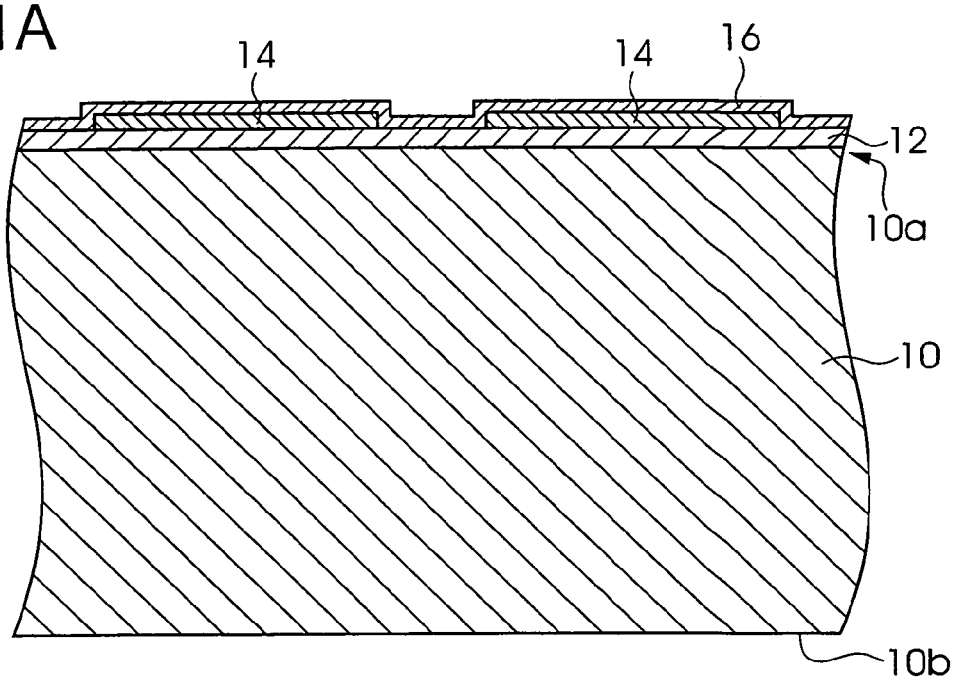
FIG. 1A and FIG. 1B are process drawings showing the manufacturing method for a semiconductor device according to a first embodiment of the present invention.

The Manufacturing Method for a Semiconductor Device According to the First Embodiment FIG. 1A to FIG. 6 are process drawings showing the manufacturing method for a semiconductor device according to a first embodiment of the present invention. FIG. 1A is a cross sectional drawing showing a part of the substrate, which is the processing object, in the wafer state. The substrate 10 is, for example, an Si (silicon) substrate, and on the active surface 10a side thereof, electronic elements consisting of transistors, memory elements other electric elements, along with electrical wiring (not illustrated), and electrode pads 14 that serve as the external electrodes of the electronic circuit, are formed. In contrast, on the back surface 10b of the substrate 10, these electronic circuits are not formed. The thickness of the substrate 10 is approximately 500 μm.

As shown in FIG. 1A, on the substrate 10, an insulating film 12 is formed by forming in sequence an insulating film consisting of an oxide film ($SiO_2$), which is the basic material of the substrate 10, and an interlayer insulating film consisting of a borophosphosilicate glass (BPSG). In addition, at locations (not illustrated) on a part of the insulating film 12, electrode pads 14 are formed that are electrically connected to the electronic circuits formed on the active surface 10a of the substrate 10. The electrode pads 14 are formed by depositing in sequence a first layer consisting of Ti (titanium), a second layer consisting of TiN (titanium nitride), a third layer consisting of AlCu (aluminum/copper), and a forth layer (cap layer) consisting of TiN. Note the point that electric circuits are not formed below the electrode pads 14.

An electrode pad 14 is formed, for example, by forming a laminated surface structure consisting of the first through forth layers over the entire surface of the insulating film 12 using sputtering, and then patterning the laminated surface structure into a predetermined shape (for example, a circular shape) by using a resist or the like. Note that in the present embodiment, although the case of an electrode pad 14 formed by the laminated structure described above is provided as an example in the explanation, the electrode pad 14 can be formed using only Al, and preferably formed using copper, which has a low electrical resistance. In addition, the electrode pad 14 is not limited to the structure described above, and can be appropriately modified depending on the necessary electrical properties, physical properties, and chemical properties.

In addition, on the insulating film 12 described above, a passivation film 16 is formed so as to cover the electrode pad 14. This passivation film 16 preferably is formed by $SiO_2$ (silicon dioxide), SiN (silicon nitrate), a polyimide resin, or the like, or a structure wherein $SiO_2$ is laminated on SiN, or the reverse. In addition, the thickness of the passivation film 16 is preferably equal to or greater than 2 μm and equal to or less than 6 μm.

A step is carried out on the substrate having the structure described above, wherein first the electrode pads 14 formed on the active surface 10a are opened, and the substrate 10 is etched to formed the hole portions H3. First, a resist (not illustrated) is applied over the entire surface of the passivation film 16 shown in FIG. 1A using a method such as a spin coat method, dipping method, spray coat method or the like. Note that this resist is used in order to open the passivation film 16 that covers the electrode pads 14, and can be a photoresist, an electron beam resist, or an X-ray resist, and can be either a positive or negative resist.

Figure 1B:
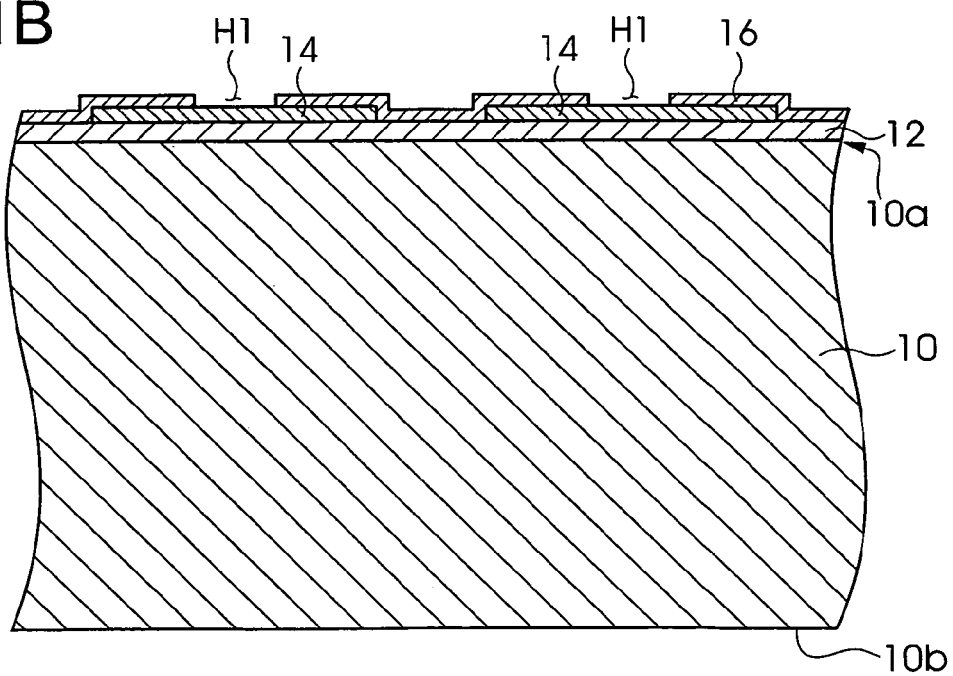

When the resist is applied to the passivation film 16, after carrying out prebaking, an exposure treatment and a development treatment are carried out using a mask on which a predetermined pattern has been formed, and the resist is patterned into a predetermined shape. Note that the shape of the resist is set depending on the shape of the opening of the electrode pad 14 and the cross-sectional shape of the hole formed in the substrate 10. When the patterning of the resist has completed, as shown in FIG. 1B, after carrying out postbaking a part of the passivation film 16 covering the electrode pad 14 is etched to form the opening portion H1. FIG. 1B is a cross-sectional drawing showing the state in which the passivation film 16 has been opened to form the opening portion H1.

Moreover, preferably dry etching is used in etching the passivation film 16. Dry etching can include reactive ion etching (RIE). In addition, wet etching can also be used in etching the passivation film 16. The cross-sectional shape of the opening portion H1 formed in the passivation film 16 is determined depending on the opening shape of the electrode pad 14 formed in a step described below and the cross-sectional shape of the holes formed in the substrate 10. The diameter of the cross-sectional shape of the opening portion H1 is approximately equal to the diameter of the opening formed in the electrode pad 14 and the diameter of the hole formed in the substrate 10, for example, 50 μm.

Figure 2A:
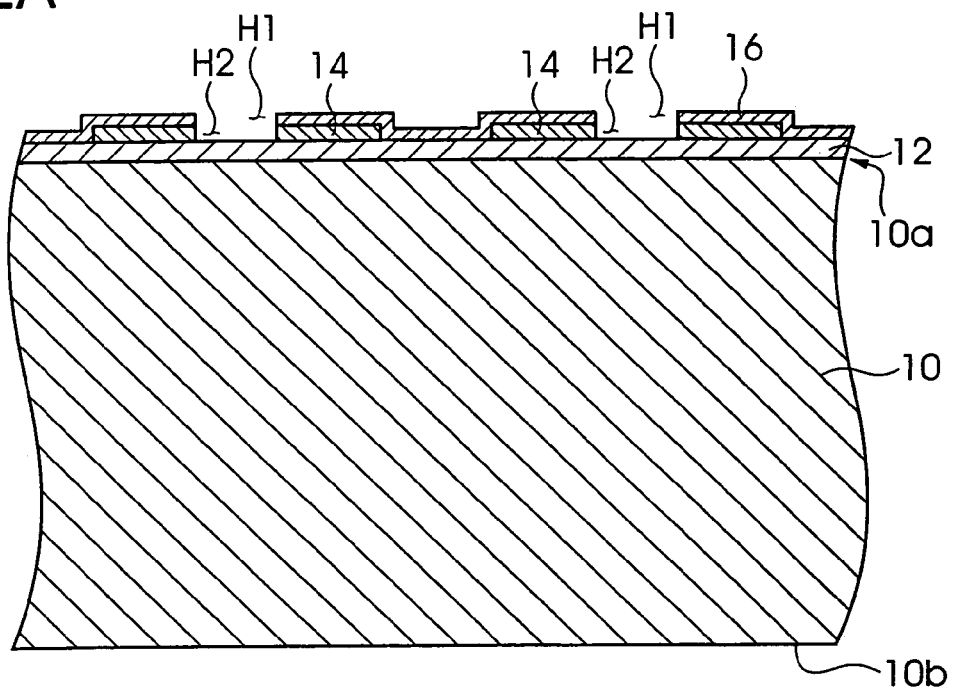
FIG. 2A and FIG. 2B are process drawings showing the manufacturing method for a semiconductor device according to a first embodiment of the present invention.

When the steps described above have been completed, the electrode pad 14 is opened by dry etching, using the resist on the passivation film 16 that formed the opening portion H1 as the mask. FIG. 2A is a cross-sectional drawing showing the state in which the opening portion H2 has been formed by opening the electrode pad 14. Note that the resist is not illustrated in FIGS. 1A, 1B, 2A, and 2B. As shown in FIG. 2A, the diameter of the opening portion H1 formed in the passivation film 16 and the diameter of the opening portion H2 formed on the electrode pad 14 are approximately identical. Note that RIE can be used for the dry etching.

Figure 2B:
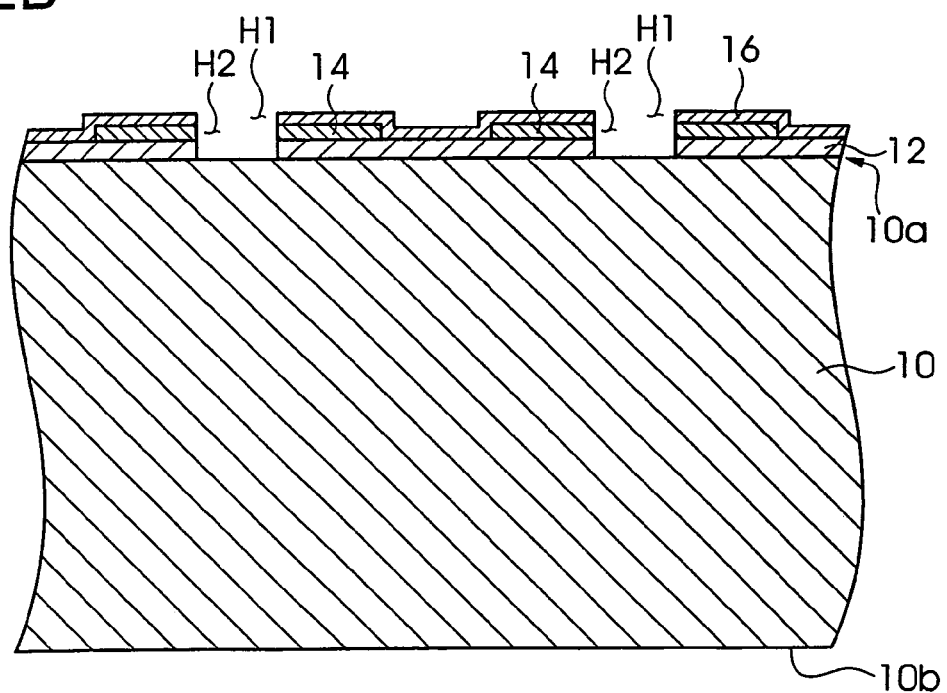

Next, the insulating film 12 is etched by using the resist used in the steps described above as a mask. As shown in FIG. 2B, the substrate 10 is exposed. FIG. 2B is a cross-sectional drawing showing the state in which the insulating film 12 has been etched to expose a part of the substrate 10. Subsequently, the resist formed on the passivation film 16 and used as the opening mask is stripped off by using a stripping liquid, ashing, or the like.

Note that in the processes described above, etching can be repeated using an identical resist mask, but of course the resist can be patterned again after completion of each etching step. In addition, after the opening portion H2 formed in the electrode pad 14 has been opened, it is also possible to strip the resist, use the TiN of the upper surface of the electrode pad 14 as the mask, etch the insulating film 12, and as shown in FIG. 2B, expose the substrate 10. Moreover, in consideration of the selection ratios for each etching time, it is necessary to thicken the resist.

When the steps described above have been completed, the hole portion H3 is formed by etching the substrate 10 by using dry etching with the passivation film 16 serving as the mask (hole portion formation step). The depth to which the substrate 10 is etched is approximately 70 μm, and thus in terms of manufacturing efficiency, preferably using the Si high speed etching method disclosed in Japanese Patent Application Laid-Open (JP-A) No. 2002-93776 or the Bosch process method disclosed in U.S. Pat. No. 5,501,893 can be used to carry out anisotropic etching. In the case of the Si high speed etching method, a mixed gas consisting of $SF_6/O_2$ can be used as the etching gas, and in the case of using the Bosch process method, $SF_6/C_4F_8$ can be used. Moreover, here in addition to RIE, ICP (inductively coupled plasma) can be used for the dry etching.

Figure 3A:
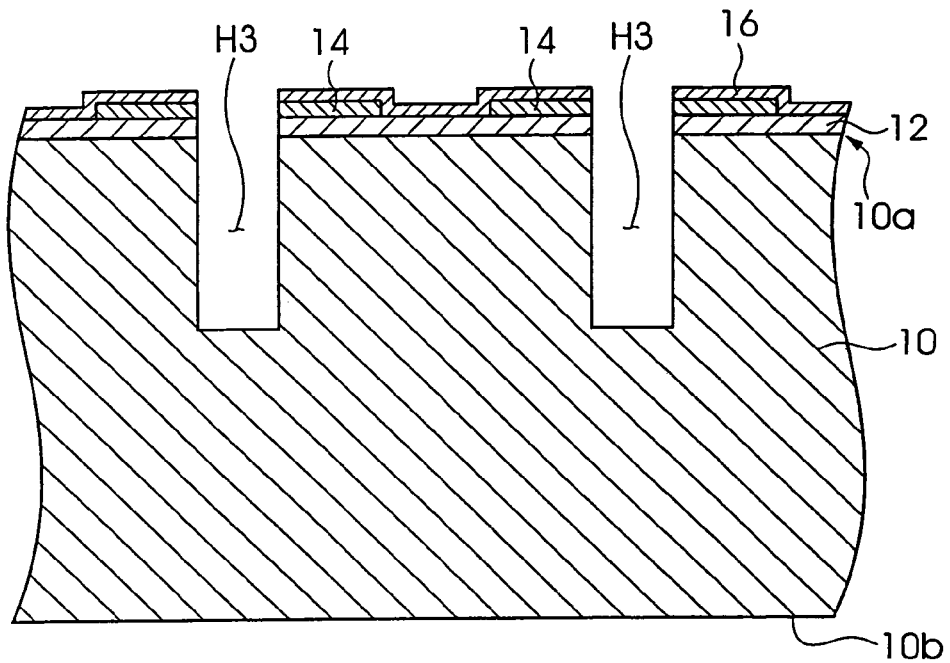
FIG. 3A and FIG. 3B are process drawings showing the manufacturing method for a semiconductor device according to a first embodiment of the present invention.

FIG. 3A is a cross-sectional drawing showing the state in which the substrate 10 has been etched and the hole portion H3 formed. As shown in FIG. 3A, because the substrate 10 has been etched using the passivation film 16 as the mask, the diameter of the hole H3 formed in the substrate 10 is approximately identical to the diameter of the opening portion H1 formed in the passivation film 16. As a result, the diameter of the opening portion H1 formed in the passivation film 16, the diameter of the opening portion H2 formed in the electrode pad 14, and the diameter of the hole H3 formed in the substrate 10 are substantially identical. Moreover, the depth of the hole portion H3 can be appropriately set depending on the thickness of the semiconductor chip that will be finally formed. In addition, because the hole portion H3 is formed using anisotropic etching, the bottom surface of the hole portion H3 has a flat shape.

Next, the step in which the bottom surface of the hole portion H3 formed in the substrate 10 is curved (curved surface formation step). In this step, using the mask that was employed when forming the hole portion H3, isotropic etching is carried out by an etching method similar to the etching method used with forming the hole portion H3. When forming the hole portion H3 described above, in the case that a Si high speed etching method is used, in which a mixed gas of $SF_6/O_2$ serves as the etching gas, the bottom surface of the hole portion H3 is curved by carrying out isotropic etching by increasing the gas ratio of the $SF_6$ or using only $SF_6$ as the etching gas. In addition, when forming the hole portion H3, in the case of using the Bosch process method, in which $SF_6/C_4F_8$ serves as the etching gas, a curved surface shape is imparted to the bottom surface of the hole portion H3 by carrying out isotropic etching by stopping etching and using only the $SF_6$ gas as the etching gas.

Moreover, above, an explanation was given in which the composition of the etching gas was changed as a method of changing from anisotropic etching to isotropic etching, but in addition to changing the composition of the etching gas, anisotropic etching can be switched to isotropic etching by lowering the bias voltage or carrying out high pressurization of the etching gas. In addition, the switch can be carried out by only decreasing the bias voltage or by high pressurization of the etching gas.

Figure 3B:
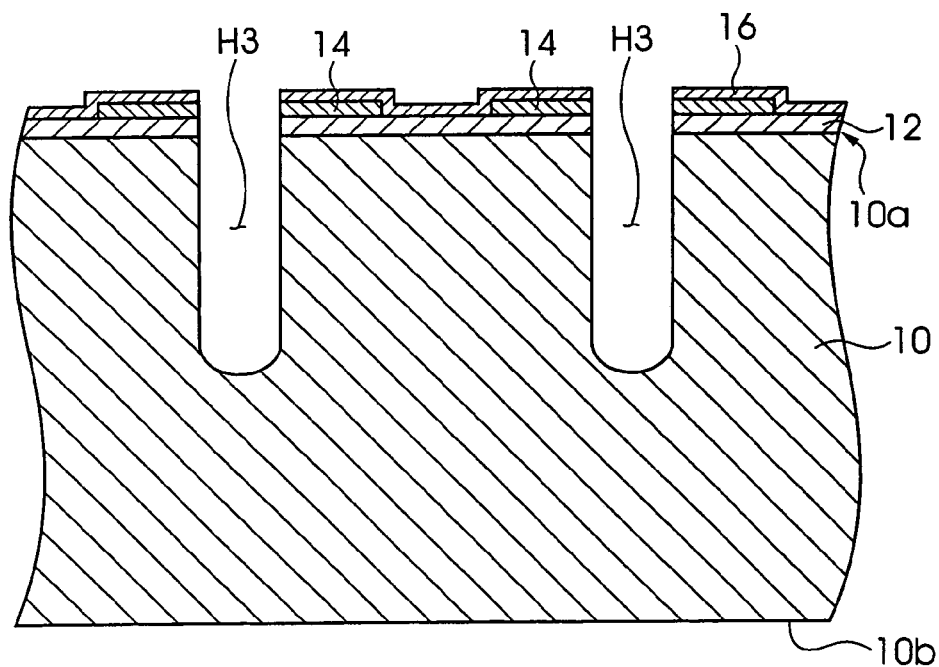

FIG. 3B is a cross-sectional drawing showing the state in which a curved surface shape has been imparted to the bottom surface of the hole portion H3 formed in the substrate 10. In the example shown in FIG. 3, it can be understood that a curved surface having a substantially semispherical shape has been imparted. In addition, it can be understood that even when the curved surface shape has been imparted to the bottom surface of the hole portion H3 by carrying out isotropic etching, the total diameter (width) of the hole portion H3 is substantially identical to the diameters of the opening portions H1 and H2.

Figure 4A:
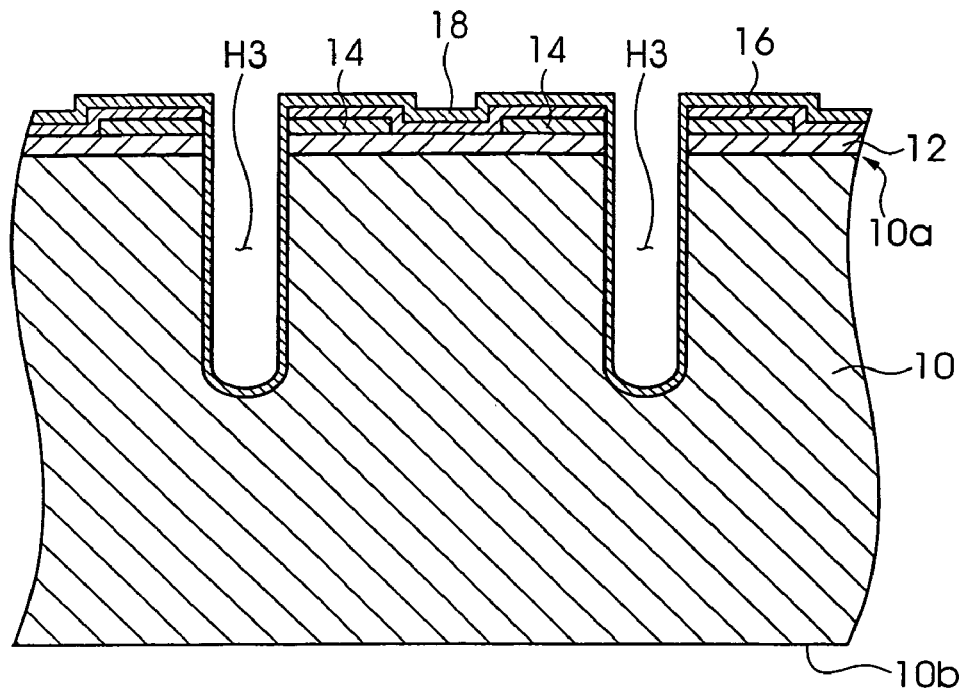
FIG. 4A and FIG. 4B are process drawings showing the manufacturing method for a semiconductor device according to a first embodiment of the present invention.

When the steps described above have been completed, next the insulating film 18 is formed on the passivation film 16 and the inner wall and bottom surface of the hole portion H3 (insulating film formation step). FIG. 4A is a cross-sectional drawing showing the state in which the insulating film 18 has been formed on the passivation film 16 and the inner wall and bottom surface of the hole portion H3. This insulating film 18 is provided in order to prevent the occurrence of current leakage, corrosion of the substrate due to oxygen and water and the like, and it is possible to use a tetraethyl orthosilicate ($Si(OC_2H_5)_4$; referred to below as TEOS) formed by using PECVD (plasma enhanced chemical vapor deposition), that is, TEOS formed using PE-TEOS or ozone CVD, or a silicon oxide formed by using $O_3$-TEOS or CVD. Moreover, the thickness of the insulating film 18 is, for example, 1 μm.

Next, a resist is applied to the entire surface of the insulating film 18 using a method such as a spin coat method, a dipping method, a spray coat method, or the like. A dry film resist can also be used. This resist is used for opening an area above a part of the electrode pad 14, and can be a photoresist, an electron beam resist, or an X-ray resist, and can be either a positive or negative resist.

When the resist has been applied to the insulating film 18, after prebaking has been carried out, an exposure treatment and a developing treatment are carried out using a mask on which a predetermined pattern has been formed, and the resist is patterned into a shape in which the resist remains only on parts other than the electrode pad 14 and the hole portion H3 and the area in proximity thereto. This shape may be, for example, a circular shape centered on the hole portion H3. When the patterning of the resist has completed, after carrying out postbaking, the insulating film 18 and the passivation film 16 that cover a part of the electrode pad 14 are removed, and a part of the electrode pad 14 is opened. Moreover, preferably dry etching is used for this etching. Dry etching may be reactive ion etching (RIE). In addition, the etching may use wet etching. Moreover, in this case, the forth layer that forms the electrode pad 14 is also removed at the same time.

Figure 4B:
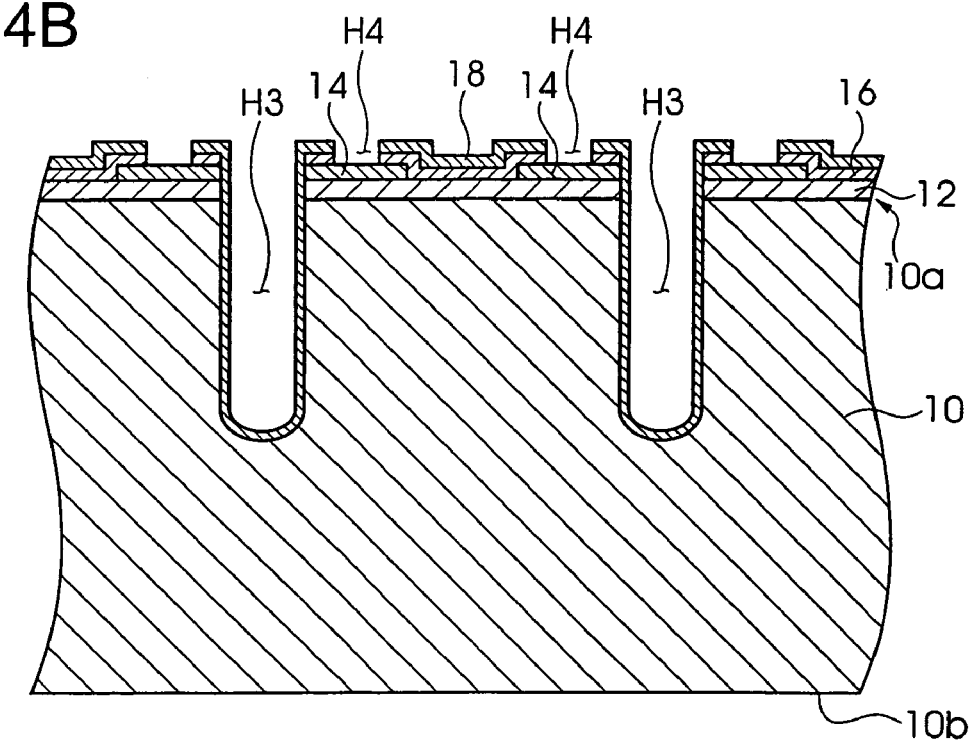

FIG. 4B is a cross-sectional drawing showing the state in which the part of the insulating film 18 and the passivation film 16 that cover the electrode pad 14 has been removed. As shown in FIG. 4B, the area above the electrode pad 14 has become the opening portion H4, and a part of the electrode pad 14 has been exposed. Due to this opening portion H4, it is possible to connect a connecting terminal 20 formed in a later step and an electrode pad 14. Therefore, an opening portion H4 can be formed at a location other than the location where a hole portion H3 has been formed. It can also be formed in proximity thereto.

In the present embodiment, an example has been given for the case in which a hole portion H3 (opening portion H1) is formed at the approximate center of an electrode pad 14. Thus, in consideration that making the exposed surface area of the electrode pad 14 large makes the connection resistance between an electrode pad 14 and a connecting terminal, formed later, small, preferably an opening portion H4 should be formed so as to surround a hole portion H3. In addition, the formation site of a hole portion H3 does not have to be at the approximate center of an electrode pad 14. Moreover, when a part of an electrode pad 14 is exposed by removing a part of the insulating film 18 and the passivation film 16 that cover the electrode pad 14, the resist used during the removal is stripped using a stripping liquid.

When the steps described above have been completed, next a step in which an undercoat film is formed is carried out. Because the undercoat film is formed over the entire surface of the substrate 10, the undercoat film is also formed on the exposed part of an electrode pad 14 and the inner wall and the bottom surface of a hole portion H3. Here, the undercoat film consists of a barrier layer and a sheet layer, and is formed by first forming the barrier layer and then forming the sheet layer on the barrier layer. The barrier layer is formed, for example, from TiW, and the sheet layer is formed, for example, from Cu.

The barrier layer and the sheet layer are formed using, for example, an IMP (ion metal plasma) method, or a PVD (physical vapor deposition) method such as vacuum deposition, sputtering, or ion plating. The undercoat film sufficiently covers the step between an electrode pad 14 and the insulating film 18, and is formed continuously over the electrode pad 14 and the insulating film 18 (including the inside of the hole portion H3). Moreover, the thickness of the barrier layer that forms the undercoat film is, for example, approximately 100 nm, and the thickness of the sheet layer is, for example, approximately several hundred μm.

When the formation of the undercoat film has been completed, a plating resist is applied to the active surface 10a of the substrate 10, and a plating resist pattern (not illustrated) is formed by patterning such that only the part that forms a connecting terminal 20 is opened. Subsequently, electrolytic Cu plating is carried out, Cu (copper) is buried in the opening portion H3 of the substrate 10 and the opening portions of the plating resist pattern, and thereby the connecting terminals 20 are formed (connecting terminal formation step).

Figure 5A:
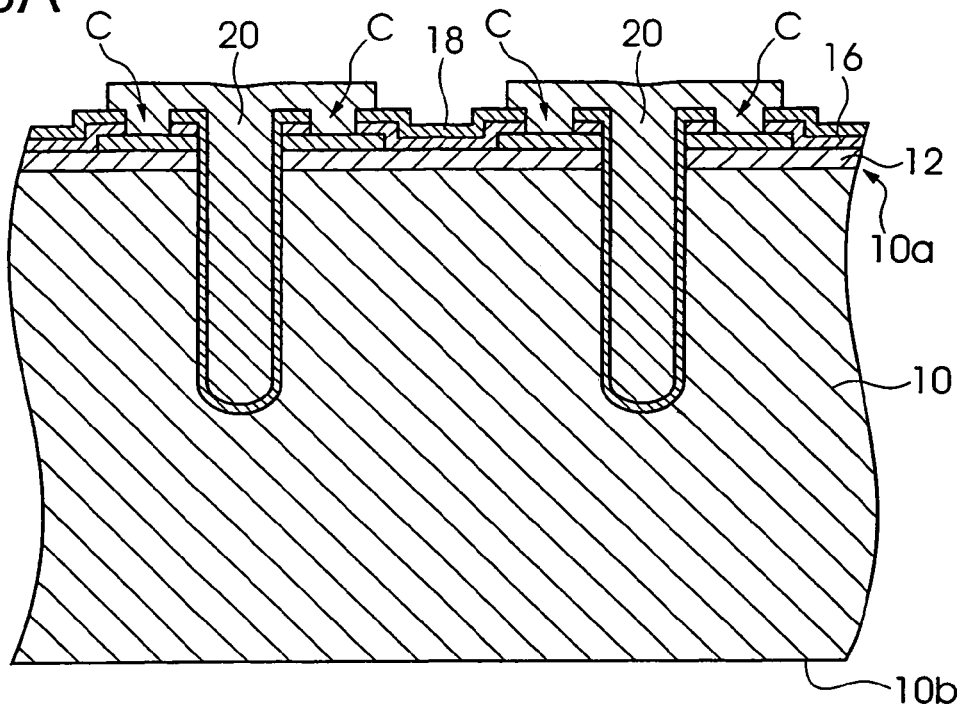
FIG. 5A to FIG. 5C are process drawings showing the manufacturing method for a semiconductor device according to a first embodiment of the present invention.

FIG. 5A is a cross-sectional drawing showing the state in which the connecting terminals 20 have been formed by carrying out electrolytic Cu plating. As shown in FIG. 5A, a connecting terminal 20 has a projecting shape that projects through the active surface 10a of the substrate 10, and at the same time, has a shape in which a part thereof is buried in the substrate 10. In addition, at the location denoted by the reference letter C, a connecting terminal 20 is electrically connected to an electrode pad 14. When a connecting terminal 20 has been formed, the plating resist pattern formed on the substrate 10 is stripped.

When the steps described above have been completed, a step is carried out in which the substrate 10 is thinned by carrying out a process on the back surface 10b of the substrate 10, and the connecting terminals 20 formed by being buried in the substrate 10 are exposed (exposure step). The processing method carried out on the back surface 10b of the substrate 10 in order to thin the substrate 10 can use back surface grinding or back surface etching. Here, the explanation is given using as an example a method in which the substrate 10 is thinned using etching.

The etching of the back surface 10b of the substrate 10 is carried out until the thickness of the substrate 10 is approximately 50 μm and the amount of the projection of the connecting terminals from the back surface 10b of the substrate 10 has attained a predetermined amount (for example, about 20 μm). In the present embodiment, the etching process is not complete with only one etching process, but different etching processes are carried out two times. This is in order to implement efficiency by shortening the time required for the etching, and at the same time, precisely control the thickness of the substrate 10 and the amount of projection of the connecting terminals 20.

Figure 5B:
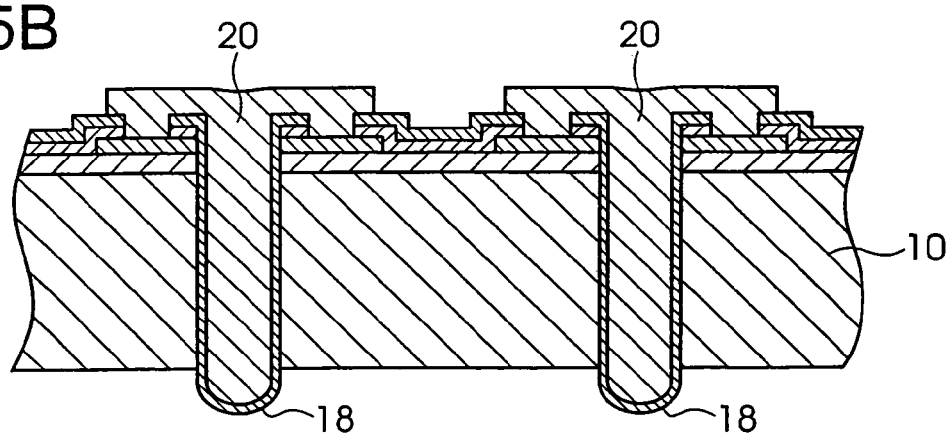

In the present embodiment, in the etching carried out first (the first etching step), the substrate 10 is etched, for example, 400 and several tens of μm, the thickness of the substrate 10 it made slightly thicker than the depth to which the connecting terminals are buried, and the connecting terminals 20 are not yet exposed from the back surface of the substrate 10. In addition, in the etching carried out next (the second etching step), the connecting terminals 20 are exposed from the back surface of the substrate 10, the thickness of the substrate 10 is approximately 50 μm, and the amount of the projection of the connecting terminals 20 from the back surface of the substrate 10 is approximately 20 μm. FIG. 5B is a cross-sectional drawing showing the state in which the second etching step has been carried out on the substrate 10.

In the first etching step described above, because the amount of etching is large, in terms of efficiency, setting the etching rate high is necessary. In the etching (second etching step) carried out next, because the thickness of the substrate 10 and the connecting terminals 20 must be precisely controlled, this etching must be carried out at an etching rate that is lower than the etching rate in the first etching step. When the back surface of the substrate 10 is etched, both the first and second etching steps can be carried out using either a dry etching or a wet etching, and it is also possible to switch between dry etching and wet etching in the first and second etchings.

In addition, in the case of carrying out wet etching in the first etching step, it is possible to use a mixture of HF (hydrofluoric) and $HNO_3$ (nitride) as an etching liquid. In the case of using the mixture of HF (hydrofluoric) and $HNO_3$ (nitride) as the etching liquid, when the volume ratio of the HF and HN03 is set at 1:4.5, and the temperature of the liquid is set to 25° C., an etching rate of approximately 37.8 μm/min is obtained. In the case of carrying out wet etching, it is possible to use, for example, wet etching that employs a dip method or a spin etching apparatus. When using a spin etching apparatus, sheet processing becomes possible.

When carrying out the first and second etching on the substrate 10, the etching rates taking into account the etching area and whether or not batch processing or sheet processing can be carried out are taken in to consideration, and the etching method that allows etching having an overall good efficiency can be selected. Moreover, the etching rate in wet etching is not controlled by the amount of the etching area, while in dry etching, the etching rate is controlled by the amount of the etching area.

Figure 5C:
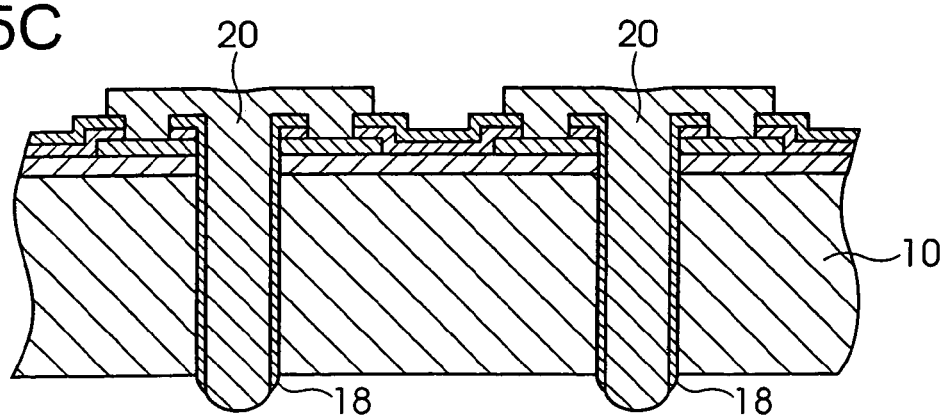

When the etching of the back surface 10b of the substrate 10 by carrying out the first and second etchings has been completed, as was described above, the connecting terminals 20 project approximately 20 μm from the back surface 10b of the substrate 10, but because of the presence of the insulating film 18 and the undercoat film (not illustrated), the connecting terminals 20 themselves are not exposed. Thus, next, a step is carried out in which the insulating film 18 and the undercoat film (not illustrated), which project from the back surface of the substrate 10, are etched in sequence (the third etching step). The insulating film 18 is etched using oxide dry etching, and the undercoat film (not illustrated) is etched by metal dry etching or wet etching FIG. 5C is a cross-sectional drawing showing the state in which the insulating film 18 and the undercoat film have been etched. As shown in FIG. 5C, a part of the connecting terminals 20 projects from the back surface of the thinned substrate 10. The height of the part of a connecting terminal 20 projecting on the active surface 10a side of the substrate 10 and the part projecting from the back surface 10b of the substrate 10 is approximately 20 μm, and the thickness of the substrate 10 is approximately 50 μm. In addition, it is understood that when a connecting terminal 20 exposed from the back surface of the substrate 10 by the first etching step through the third etching step described above, the shape of the exposed connecting terminal 20 does not change, and this shape exactly conforms to the semispherical curved surface formed at the bottom surface of the hole portion H3.

Moreover, here, a method in which the substrate 10 was thinned by etching to expose the connecting terminals 20 was explained, but carrying out thinning by grinding the back surface can also be carried out. The back surface grinding can use a step in which the thickness of the substrate 10 is thinned to the buried depth of the connecting terminals 20, and preferably a step is used in which the connecting terminals 20 are exposed from the back surface 10b of the substrate 10 and then a step is used in which the insulating film 18 and the undercoat film are removed. The reason is that the distal ends of the connecting terminals 20 would also be ground, and thereby the shapes would, for example, become flat.

When the steps described above have been completed, a lead free solder (Sn/Ag) is formed on one of the ends of the connecting terminals 20. Note that the lead free solders are not illustrated. When the formation of the lead free solders has completed, the substrate 10 in the wafer state is diced, and the individual semiconductor chips are separated (dicing step). Here, the dicing of the substrate 10 can be carried out along a street lines (scribe lines) cut into the substrate 10 in advance.

Next, the individual separated semiconductor chips are stacked to produce the three-dimensional packaging structure (stacking step). To stack the semiconductor chips, first a step is carried out in which a bonding activator (flax) is applied onto the lead free solder formed on a connecting terminal 20 that has been formed in the semiconductor chip. When the semiconductor chips are stacked together, this flax holds the semiconductor chip by adhesive force so that the misalignment of the stacked semiconductor chips does not occur. At the same time, it also strips the oxygen film on the surface of the connecting terminals 20 that have been formed on the semiconductor chip.

Figure 6:
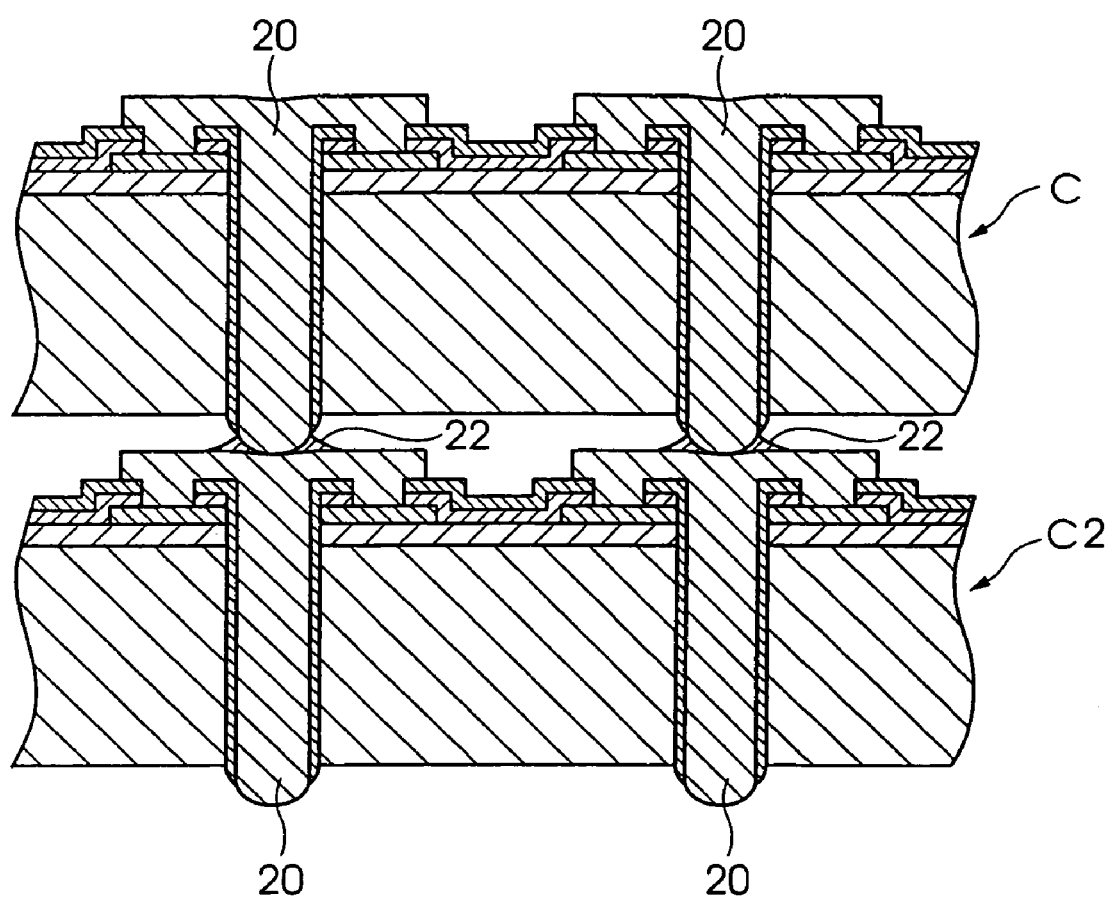
FIG. 6 is a process drawing showing the manufacturing method for a semiconductor device according to a first embodiment of the present invention.

When the application of the flax has been completed, as shown in FIG. 6, the semiconductor chip C1 and the semiconductor chip C2 are aligned, and the semiconductor chip C1 is stacked on semiconductor chip C2. Here, the stacked semiconductor chips can be the same type (that is, the electric circuits formed on the substrate are the same), or can be different types (that is, the electric circuits formed on the substrate are different).

When the steps described above are completed, the stacked semiconductor chips C1 and C2 are disposed in a reflow apparatus, the lead free solders provided on the distal ends of the connecting terminals 20 formed on the semiconductor chips C1 and C2 are melted, and the connecting terminals 20 formed on the semiconductor chip C1 and the connecting terminals 20 formed on the semiconductor chip C2 are bonded (bonding step). As shown in FIG. 6, the distal ends of the connecting terminals 20 formed on the semiconductor chip C1 on the back surface side (the semiconductor chip C2 side) have a curved surface, the bonding strength increases because the bonding area of the lead free solder 22 is large, and thereby it is possible to implement an improvement of the reliability.

Note that as shown in FIG. 6, an explanation was given above for the example of the case in which the semiconductor chip C1 and the semiconductor chip C2 are stacked, but in the case that the semiconductor chips obtained by cutting the substrate 10 are mounted on a mounting substrate such as an interposer, it is possible to mount the semiconductor chips using a step that is identical to the case of stacking semiconductor chips together. In this case, the connecting terminals serving as the connecting portion formed on the mounting substrate and the connecting terminals 20 formed on the semiconductor chip are aligned, then the semiconductor chip is mounted on the interposer (mounting step), and the connecting electrodes and the connecting terminals are bonded (bonding step).

In addition, in configurations other than mounting semiconductor chips on an interposer, in place of the interposer, a processed semiconductor device an be stacked on a substrate by using W-CSP (wafer level chip scale package). Here, W-CSP technology denotes technology in which individual chips are separated after carrying out wire redistribution and rerouting and resin sealing all at once while still in the wafer form. When a processed semiconductor chip is stacked on the substrate by using W-CSP technology, semiconductor chips can be stacked on the electrodes formed by wire redistribution and rerouting, and connecting terminals identical to the connecting terminals formed on semiconductor chips C1 and C2 can be formed in the substrate in the wafer state, and these connecting terminals and the connecting terminals formed on the semiconductor chips can be bonded and stacked.

Manufacturing method for a semiconductor device according to a second embodiment FIG. 7 to FIG. 12 is a step diagram showing a manufacturing method for a semiconductor device according to a second embodiment of the present invention. In this embodiment as well, first, using the substrate 10 having the structure formed in FIG. 1A, the opening of the passivation film 16, the opening of the electrode pads 14, and the opening of the insulating film 12 are carried out in sequence, and as shown in FIG. 2B, the exposing of a part of the substrate 10 is identical to that of the first embodiment.

Figure 7A:
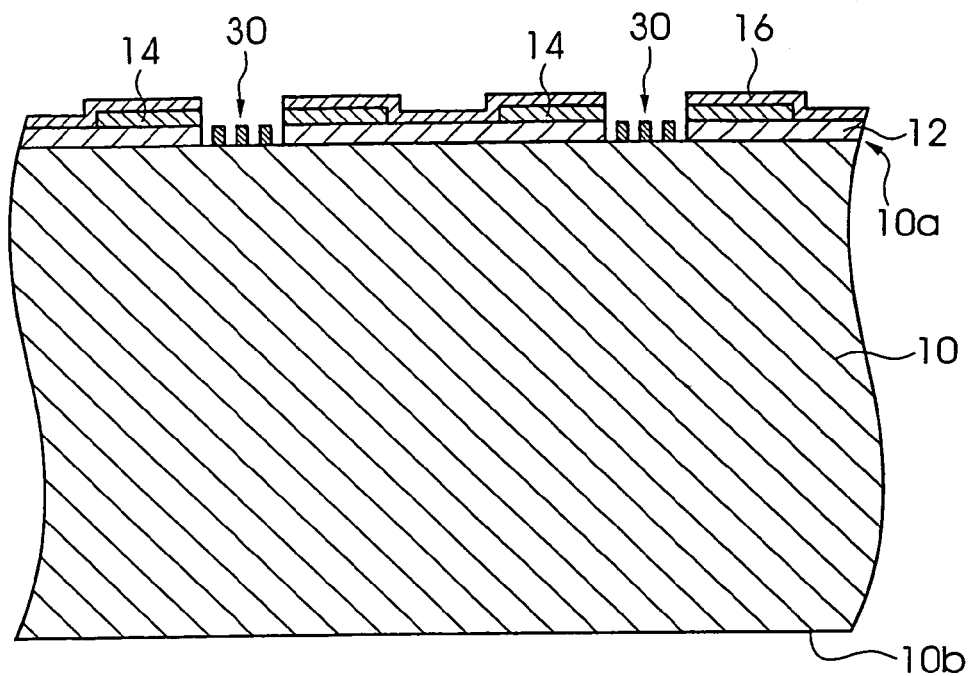
FIG. 7A and FIG. 7B are process drawings showing the manufacturing method for a semiconductor device according to a second embodiment of the present invention.
Figure 7B:
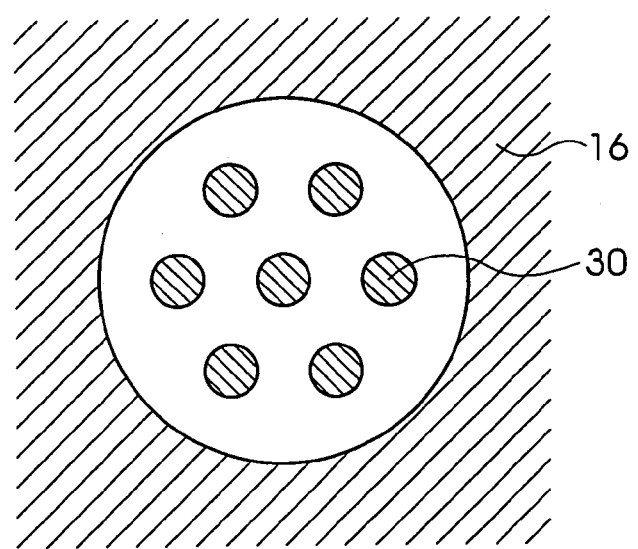

In the present embodiment, in the opening portions H1 and H2 that expose a part of the substrate 10, which has the shape shown in FIG. 2B, masks having a predetermined shape are formed. FIG. 7A is a cross-sectional drawing showing the state in which masks have been formed in the opening portions H1 and H2, and FIG. 7B is an a drawing of the top surface showing an example of the masks. The masks 30 formed inside the opening portions H1 and H2 are for imparting a concavo-convex shape to the bottom surface of the hole portion H5 formed by etching the substrate 10. A mask 30 is a pattern with an arbitrary shape having a width that is smaller than the diameter of the hole H5 formed by etching the substrate 10, and is formed in plurality. In the present embodiment, as shown in FIG. 7, cylindrical masks are formed in plurality. Note that the shape, number and arrangement of the masks 30 are arbitrary.

Figure 8A:
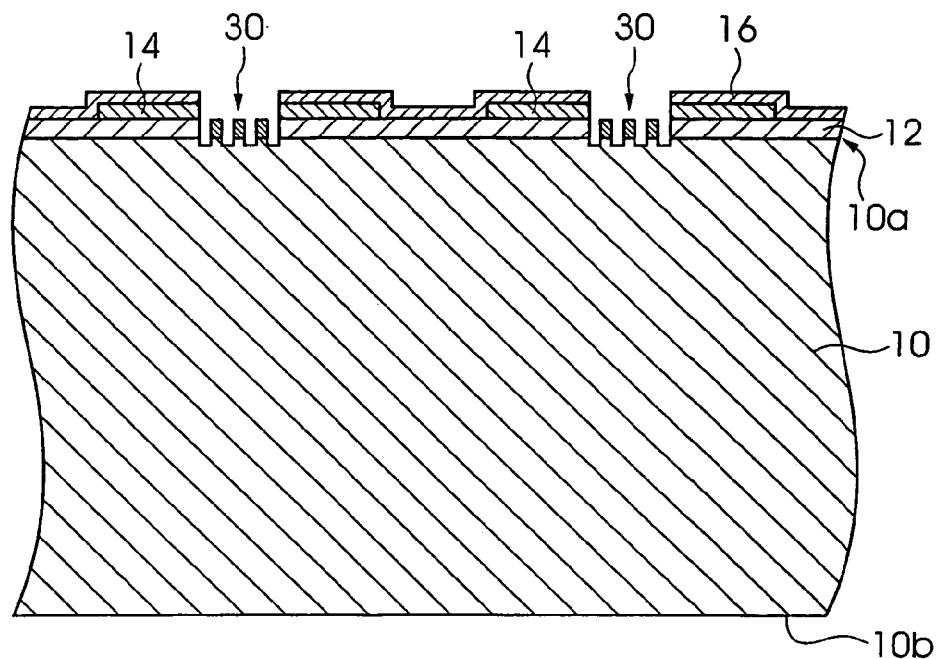
FIG. 8A and FIG. 8B are process drawings showing the manufacturing method for a semiconductor device according to a second embodiment of the present invention.

When the formation of the masks 30 has been completed, the exposed sites on the substrate 10 (the locations exposed in the opening portions H1 and H2) are etched using the masks 30, and these locations have imparted thereto a concavo-convex shape (the concavo-convex shape formation step). FIG. 8A is a cross-sectional drawing showing the state in which the concavo-convex shape has been formed by etching the exposed locations in the substrate 10. The amount of the etching of the substrate 10 is approximately 1 to 10 μm. When the concavo-convex shape has been formed, an oxide film 32 such as $SiO_2$ is formed on the upper surface of the substrate 10 and inside the opening portions H1 and H2 after the masks formed in the opening portions H1 and H2 have been removed.

Figure 8B:
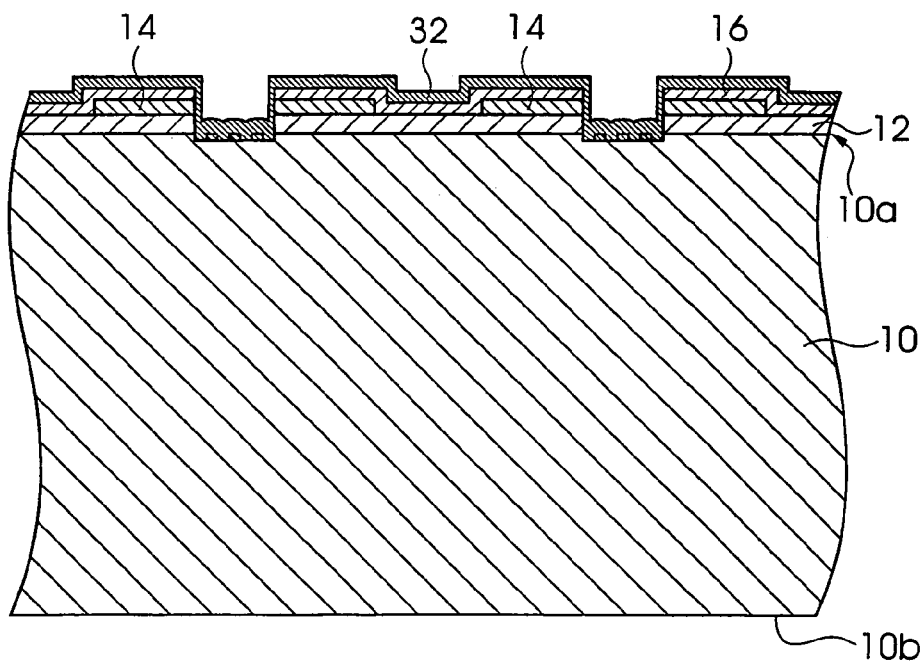
Figure 9A:
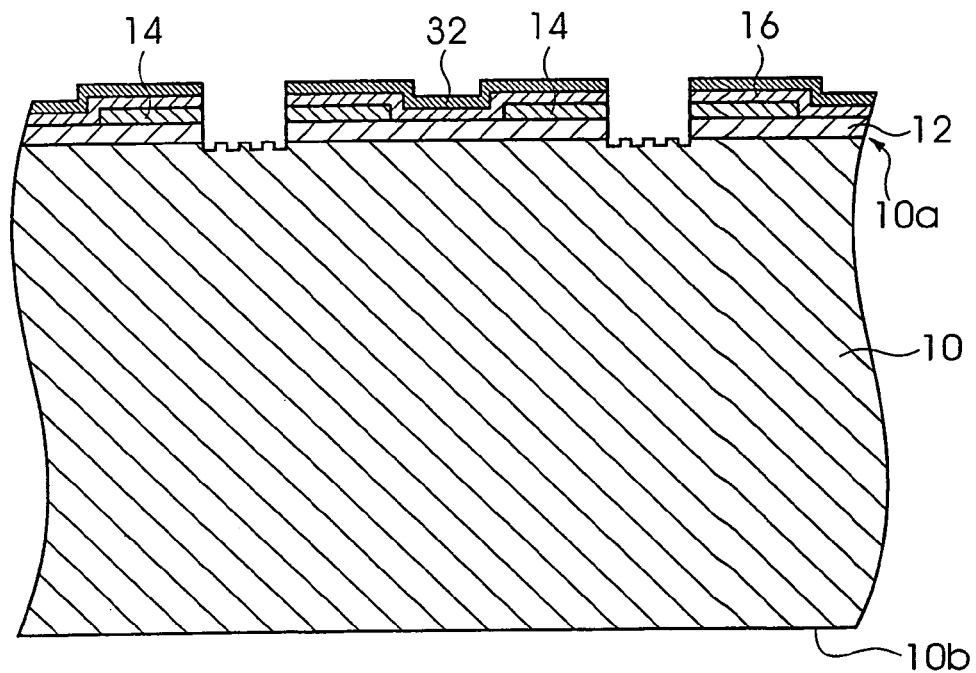
FIG. 9A and FIG. 9B are process drawings showing the manufacturing method for a semiconductor device according to a second embodiment of the present invention.

FIG. 8B is a cross-sectional drawing showing the state in which the oxide film 32 has been formed. After the formation of the oxide film 32 has completed, only the oxide film 32 formed inside the opening portions H1 and H2 is removed by the etching. FIG. 9A is a drawing showing the state in which the oxide film 32 has been patterned. When the steps described above have been completed, the hole portions H5 are formed by etching the substrate 10 using dry etching (hole formation step). Because the depth to which the substrate 10 is etched is approximately 60 to 70 μm, preferably anisotropic etching is carried out using the Si high speed etching method or the Bosch process method described above. When using the Si high speed etching method, it is possible to use a mixed gas of $SF_6/O_2$ as the etching gas, and when using the Bosch process method, it is possible to use $SF_6/C_4F_8$. Note that here it is possible to use ICP (inductively coupled plasma) in addition to RIE for the dry etching.

Figure 9B:
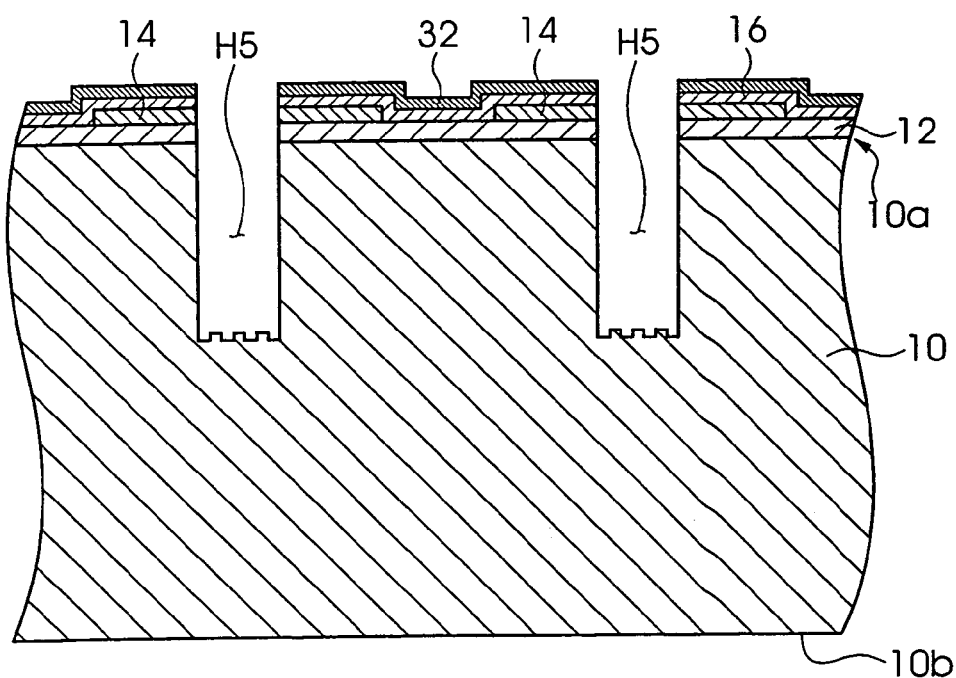
Figure 10A:
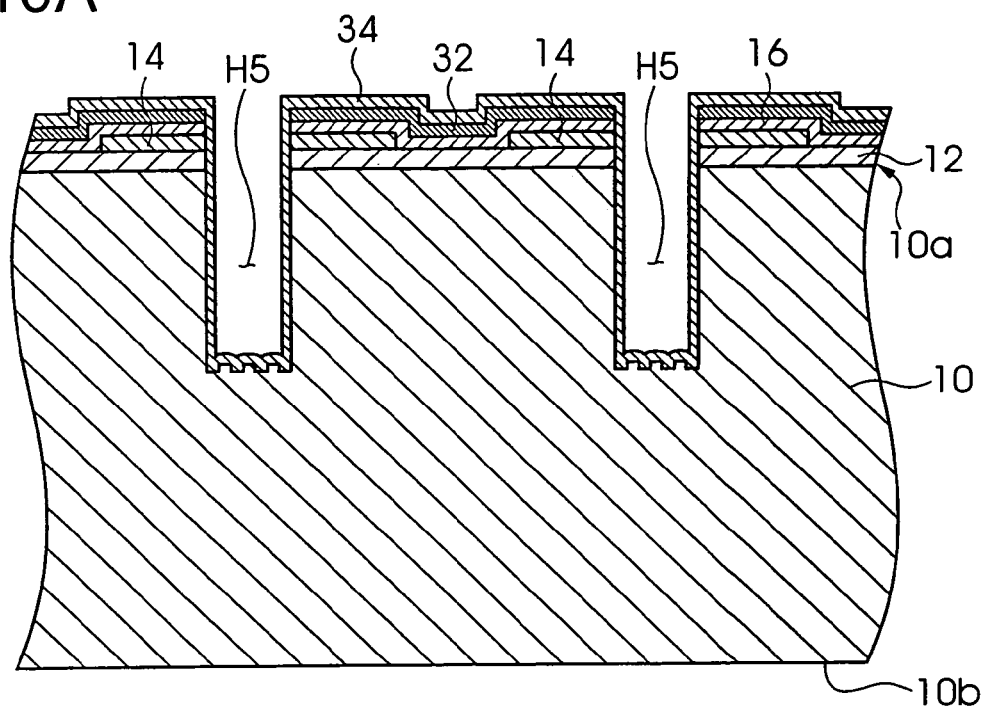
FIG. 10A and FIG. 10B are process drawings showing the manufacturing method for a semiconductor device according to a second embodiment of the present invention.

FIG. 9B is a cross-sectional drawing showing the state in which the hole portions H5 have been formed by etching the substrate 10. Referring to FIG. 9B, it can be understood that the entire diameter of the formed hole portions H5 is approximately identical to the diameter of the opening portions H1 and H2. In addition, it can be understood that the bottom surfaces of the hole portions H5 conform to the concavo-convex shape formed in the step shown in FIG. 9A. When the steps described above have been completed, next the insulating film 34 is formed on the oxide film 32 and on the inside walls and bottom surfaces of the hole portions H5 (insulating film formation step). FIG. 10A is a cross-sectional drawing showing the state in which the insulating film 34 has been formed on the oxide film 32 and on the inside walls and bottom surfaces of the hole portions H5. This insulating film 34, like the insulating film 18 formed in the first embodiment, is provided in order to prevent the occurrence of current leakage and corrosion and the like of the substrate 10 due to oxygen and water, for example, and is formed using methods identical to those of the first embodiment.

Next, a resist (not illustrated) is applied using a method such as spin coating, dipping, spray coating or the like over the entire surface of the insulating film 34. A dry film resist can also be used. Note that this resist is used for opening an area above a part of the electrode pads 14, and can be a photoresist, an electron beam resist, or an X-ray resist, and can be either a positive or negative resist.

When the resist has been applied on the insulating film 34, after prebaking has been carried out, an exposure treatment and a developing treatment are carried out using a mask that is formed having a predetermined shape. The resist is patterned into a shape in which the resist remains only in parts other then the electrode pads 14 and the hole portions H5 and the area proximate thereto. This shape may be, for example, a circular shape centered on the hole portion H5. When the patterning of the resist has completed, after carrying out postbaking, the insulating film 34, the oxide film 32, and the passivation film 16 that cover a part of the electrode pad 14 are removed, and a part of the electrode pad 14 is opened.

Figure 10B:
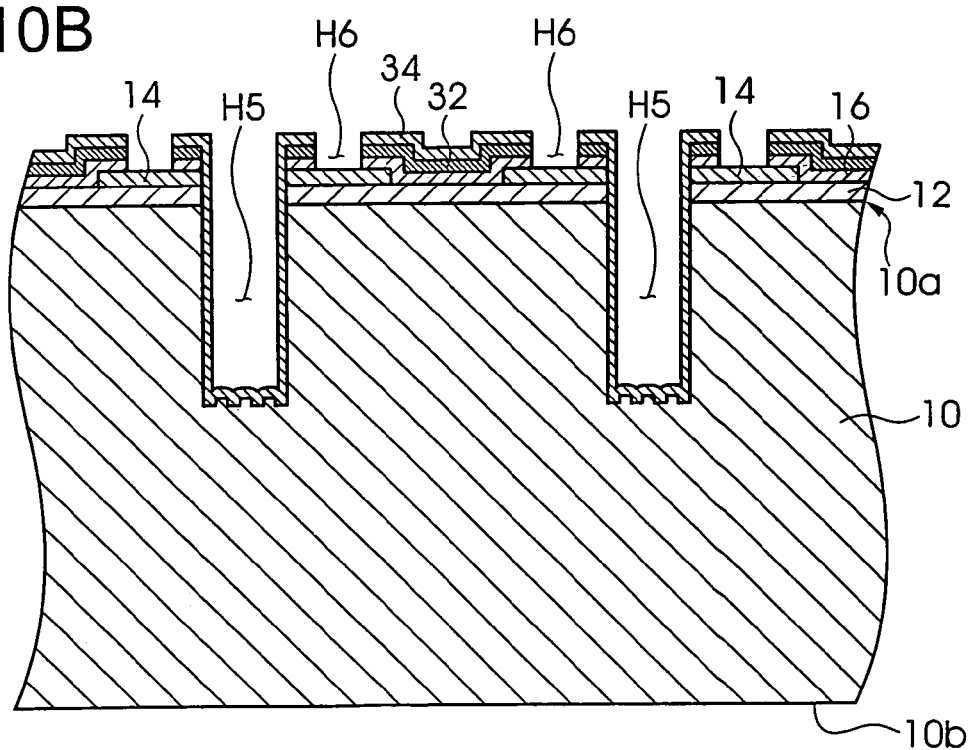

FIG. 10B is a cross-sectional drawing showing the state in which a part of the insulating film 34, the oxide film 32, and the passivation film 16 that cover the electrode pads 14 have been removed. As is shown in FIG. 10B, the area above the electrode pads 14 serves as the opening portion H6, and a part of the electrode pads 14 is exposed. Due to the opening portion H6, it is possible to connect the connecting terminals 36 and the electrode pads 14 formed in the steps below. Therefore, the opening portion H6 can be formed at a site outside the site at which the hole portion H5 is formed. In addition, it can be formed in proximity thereto. In addition, like the first embodiment, making the exposed area of the electrode pads 14 large is preferable in terms of making the connection resistance between the electrode pads 14 and the connecting terminals formed subsequently small. In addition, the formation location of the hole portions H5 need not be at the approximate center of the electrode pads 14. Note that when the insulating film 34, the oxide film 32, and the passivation film 16 that cover the electrode pads 14 is removed and a part of the electrode pads 14 is exposed, the resist used during the removal is stripped using a stripping liquid.

When the steps described above have been completed, next a step is carried out in which an undercoat film is formed. Note that this step and the undercoat film are not illustrated. Because the formation method of the undercoat film is identical to that in the first embodiment, its explanation is omitted here. When the formation of the undercoat film has been completed, a plating resist is applied on the active surface 10a of the substrate 10, only the part forming the connecting terminals 36 is patterned in an open state, and the plate pattern (not illustrated) is formed. Subsequently, Cu (copper) is buried in the opening portion H5 in the substrate 10 and the opening portions in the plating resist pattern by Cu electrolyte plating, and the connecting terminals 36 are formed (connecting terminal formation step).

Figure 11A:
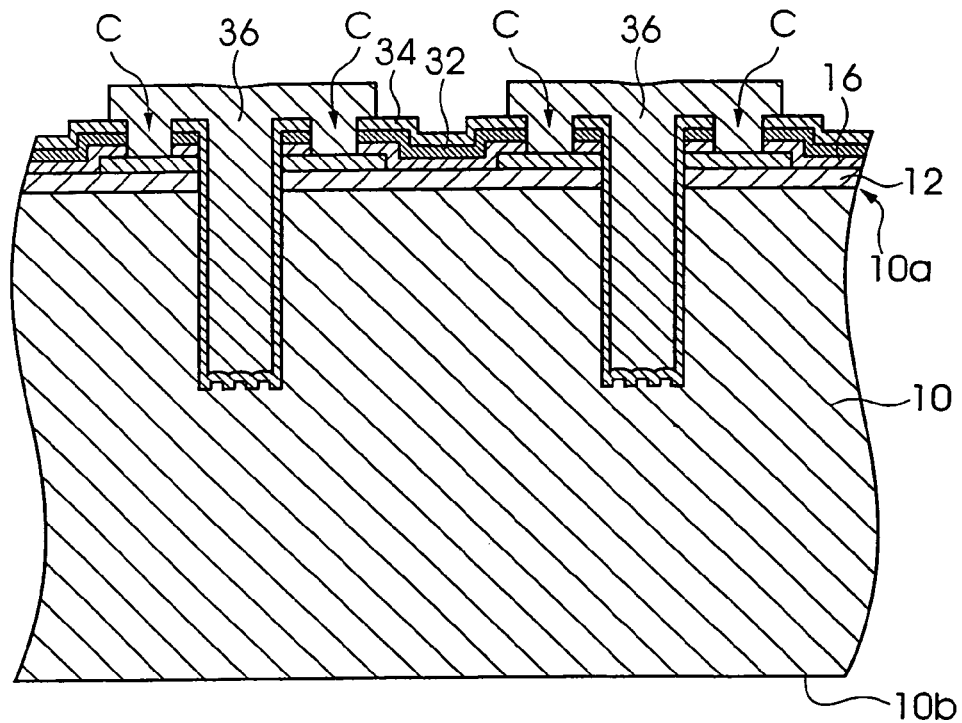
FIG. 11A to FIG. 11C are process drawings showing the manufacturing method for a semiconductor device according to a second embodiment of the present invention.

FIG. 11A is a cross-sectional drawing showing the state in which the connecting terminals 36 have been formed by carrying out Cu electrolytic plating. As shown in FIG. 5A, a connecting terminal 36 has a projecting shape that projects on the active surface 10a of the substrate 10, and at the same time, a part thereof is buried in the substrate 10. In addition, at the location indicated by reference letter C, the connecting terminal 36 is electrically connected to an electrode pad 14. When the connecting terminals 36 have been formed, the plating resister pattern formed on the substrate 10 is stripped.

When the steps described above have been completed, a step is carried out in which the substrate 10 is thinned by carrying out processing on the back surface 10b of the substrate 10, and the connecting terminals 36 formed buried in the substrate 10 are exposed (the exposure step). Like the first embodiment, the processing method carried out on the back surface 10b of the substrate 10 in order to thin the substrate 10 can use the etching methods consisting of the first etching step to the third etching step. Note that instead of the first etching step, a back surface grinding step can also be used.

Figure 11B:
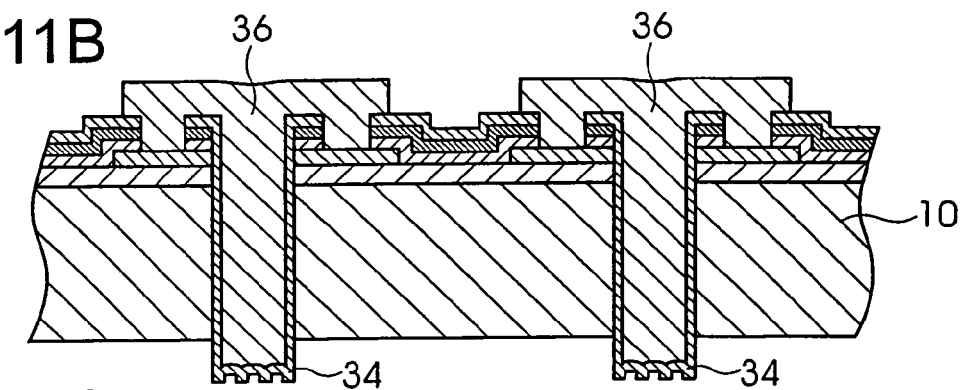

The etching (the first etching step and second etching step) of the back surface 10b of the substrate 10 is carried out until the thickness of the substrate 10 is approximately 50 μm and the amount of the projection of the connecting terminals 36 from the back surface 10b of the substrate 10 attains a predetermined amount (for example, approximately 20 μm). FIG. 11B is a cross-sectional drawing showing the state in which the second etching step has been carried out on the substrate 10. As shown in FIG. 11B, because the connecting terminals 36 are not exposed and they are covered by the insulating film 34 and the like, a step is carried out in which a part of the insulating film 34 is removed by a third etching step.

Figure 11C:
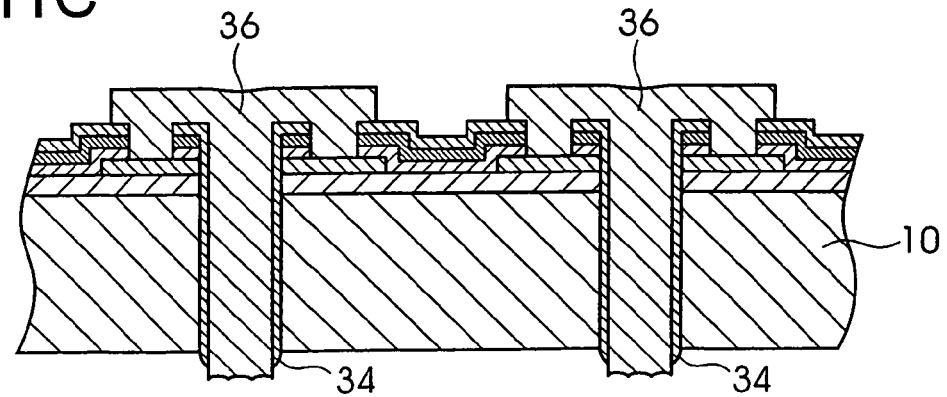

FIG. 11C is a cross-sectional drawing showing the state in which the insulating film 34 and the undercoat film have been etched. As shown in FIG. 11C, a part of the connecting terminals 36 projects from the back surface of the thinned substrate 10. In addition, when the connecting terminals 36 are exposed from the back surface of the substrate 10 by the first etching step through third etching step described above, the shape of the exposed connecting terminals 36 has not changed, and it can be understood that the exposed connecting terminals 36 substantially conform to the concavo-convex shape formed at the bottom surface of the hole portion H5.

When the steps described above have been completed, a lead free solder (Sn/Ag) is formed on either of the distal ends of a connecting terminal 36. Note that the lead free solder is not illustrated. When the formation of the lead free solder has been completed, the substrate 10 in the wafer state is diced and the individual semiconductor chips are separated (dicing step). Here, the dicing of the substrate 10 is carried out along the street lines (scribe lines) cut into the substrate 10 in advance.

Next, the individual semiconductor chips that have been separated are stacked to form the three-dimensional packaging structure (staking step). To stack the semiconductor chips, first a step is carried out in which a bonding activator (flax) is applied onto the lead free solder formed on a connecting terminal 36 formed in the semiconductor chip. When the semiconductor chips are stacked together, this flax holds the semiconductor chip by adhesion so that the misalignment of the stacked semiconductor chips does not occur. At the same time, it also strips the oxygen film on the surface of the connecting terminals 36 that have been formed on the semiconductor chip.

Figure 12:
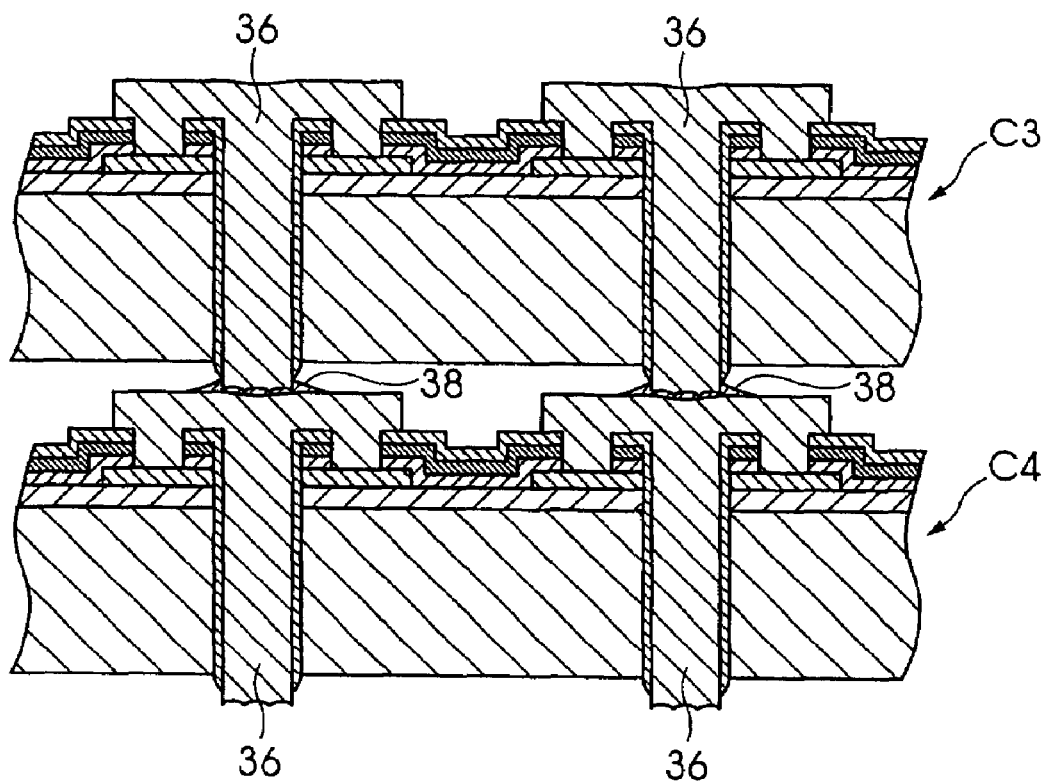
FIG. 12 is a process drawing showing the manufacturing method for a semiconductor device according to a second embodiment of the present invention.

When the application of the flax has been completed, as shown in FIG. 12, the semiconductor chip C3 is stacked on the semiconductor chip C4 by carrying out alignment semiconductor chip C3 and the semiconductor chip C4 such that the locations of each of the connecting terminals 36 formed in the semiconductor chips are aligned. Here, the stacked semiconductor chips can be the same type (that is, the electric circuits formed on the substrate are the same), or can be different types (that is, the electric circuits formed on the substrate are different).

When the steps described above have been completed, the stacked semiconductor chips C3 and C4 are disposed in a reflow apparatus, the lead free solders provided on the distal ends of the connecting terminals 36 formed on the semiconductor chips C3 and C4 are melted, and the connecting terminals 36 formed on the semiconductor chip C3 and the connecting terminals 36 formed on the semiconductor chip C4 are bonded (bonding step). As shown in FIG. 12, the distal ends of the connecting terminals 36 formed on the semiconductor chip C3 on the back surface side (the semiconductor chip C4 side) have a concavo-convex shape, the bonding strength increases because the bonding area of the lead free solder 38 is large, and thereby it is possible to implement an improvement of the reliability.

Moreover, an explanation was given above of the example of the case in which the semiconductor chip C3 and the semiconductor chip C4 are stacked, but, like the first embodiment, the semiconductor chips obtained by dicing the substrate 10 can be mounted on a mounting substrate such as an interposer or mounted on a substrate processed using W-CSP technology.

Manufacturing method for a semiconductor device according to the third embodiment FIG. 13 to FIG. 17 are step diagrams showing the manufacturing method for a semiconductor device according to a third embodiment of the present invention. In the present embodiment as well, first, using a substrate 10 having the structure shown in FIG. 1A, the opening of the passivation film 16, the opening of the electrode pads 14, and the opening of the insulating film 12 are carried out in sequence, and as shown in FIG. 2B, the exposing of a part of the substrate 10 is identical to that in the first embodiment.

Figure 13A:
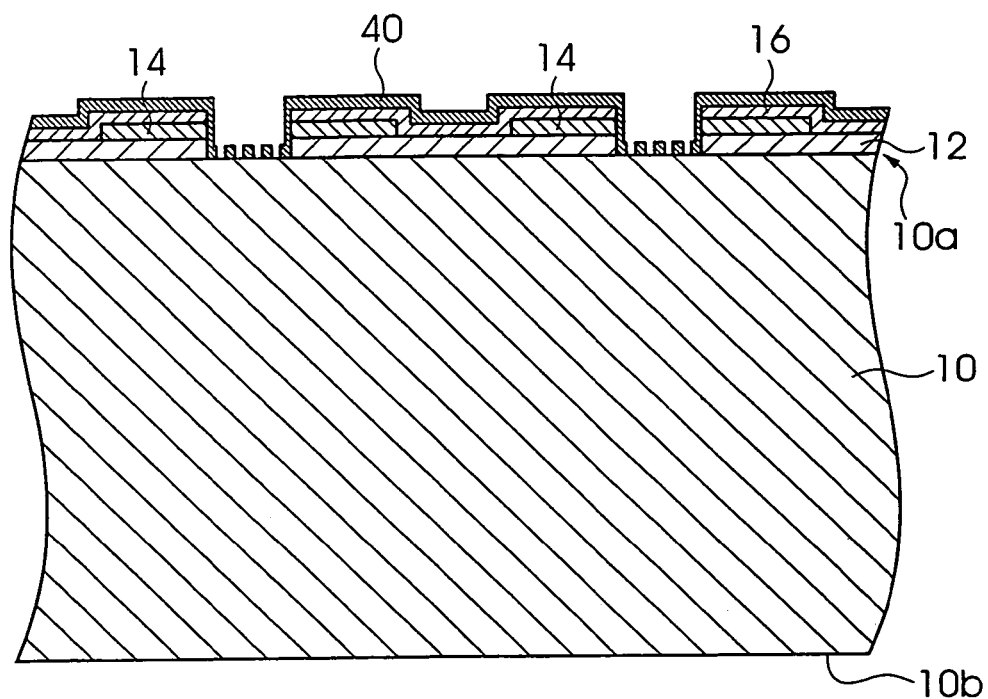
FIG. 13A to FIG. 13B are process drawings showing the manufacturing method for a semiconductor device according to a third embodiment of the present invention.
Figure 13B:
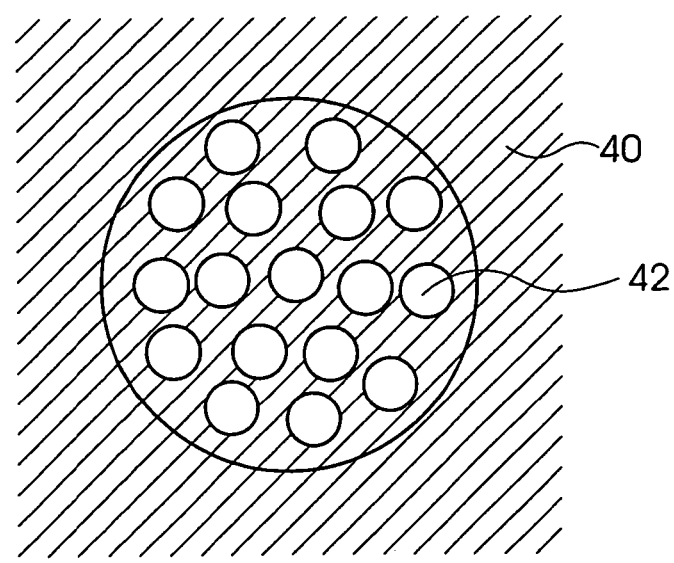

In the present embodiment, the insulating film 40 consisting of $SiO_2$ or the like is formed on the passivation film 16, including the opening portions H1 and H2, from which a part of the substrate in the state shown in FIG. 2B is exposed, and the insulating film 40 formed in the opening portions H1 and H2 is patterned into a predetermined shape (mask formation step). FIG. 13A is a drawing showing the state in which the insulating film 40 formed on the passivation film 16 has been patterned, and FIG. 13B is a drawing of the upper surface of the insulating film 40 formed inside the opening portions H1 and H2 after patterning. Note that the area exposed in the opening portions H1 and H2 corresponds to what is termed in the present invention the hole formation area.

As shown in FIGS. 13A and 13B, the insulating film 40 inside the opening portions H1 and H2 is opened so as to have a plurality of holes 42. This insulating film 40 forms the hole portions H7 (refer to FIG. 14) by etching the substrate 10, and are for imparting a concavo-convex shape to the bottom surface of the formed hole portions H7. The diameter, arrangement, and number of the hole portions H7 formed in the insulating film 40 are determined depending on the shape and diameter of the holes H7 formed in the substrate 10, and the amount of side etching while forming the hole portions H7.

Figure 14A:
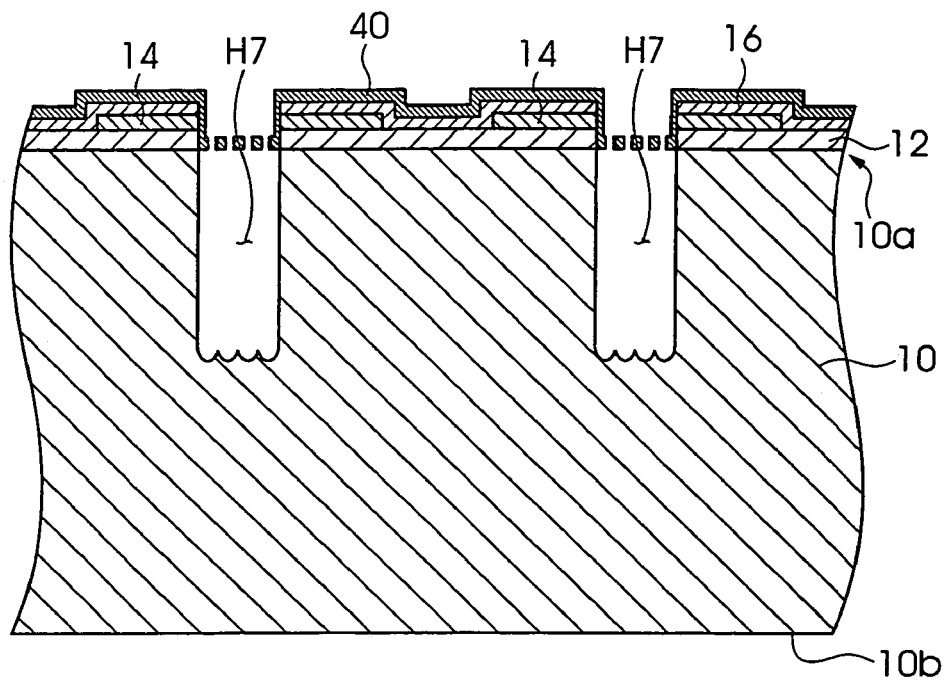
FIG. 14A and FIG. 14B are process drawings showing the manufacturing method for a semiconductor device according to a third embodiment of the present invention.

When the patterning of the insulating film 40 has been completed, the hole portions H7 are formed by etching the substrate 10 through each of the hole portions 47 formed in the insulating film 40 (concavo-convex shape formation step). FIG. 14A is a cross-sectional drawing showing the state in which the hole portions H7 have been formed by etching substrate 10 through each of the holes 42 formed in the insulating film 40. In the present embodiment, when the hole portions H7 are formed, like the first embodiment, anisotropic etching is carried out using a Si high speed etching method or a Bosch process method, and the hole portions H7 are etched such that there is a slight side etching by adjusting the gas ratio of the etching gases, the pressure of the etching gases, and the bias voltage. Moreover, this etching method corresponds to a hole portion etching method, as termed in the present invention, in which there is a slight widening in the surface direction of the substrate.

Thereby, the substrate 10 is etched through each of the holes 42 formed in the insulating film 40, and as the etching progresses, the gaps between the holes that correspond to each of the holes 42 narrows due to the side etching, and finally, the one hole portion H7 shown in FIG. 14A is formed. In addition, when the substrate 10 is etched using the insulating film 40, as shown in FIG. 14A, a concavo-convex shape is imparted to the bottom surface of the formed hole portions H7. Although the diameter of the formed hole portion H7 widens slightly in the surface direction of the substrate 10 by an amount equivalent to the side etching, as shown in FIG. 14A, it can be understood that the entire diameter is substantially identical to that of the opening portions H1 and H2.

Figure 14B:
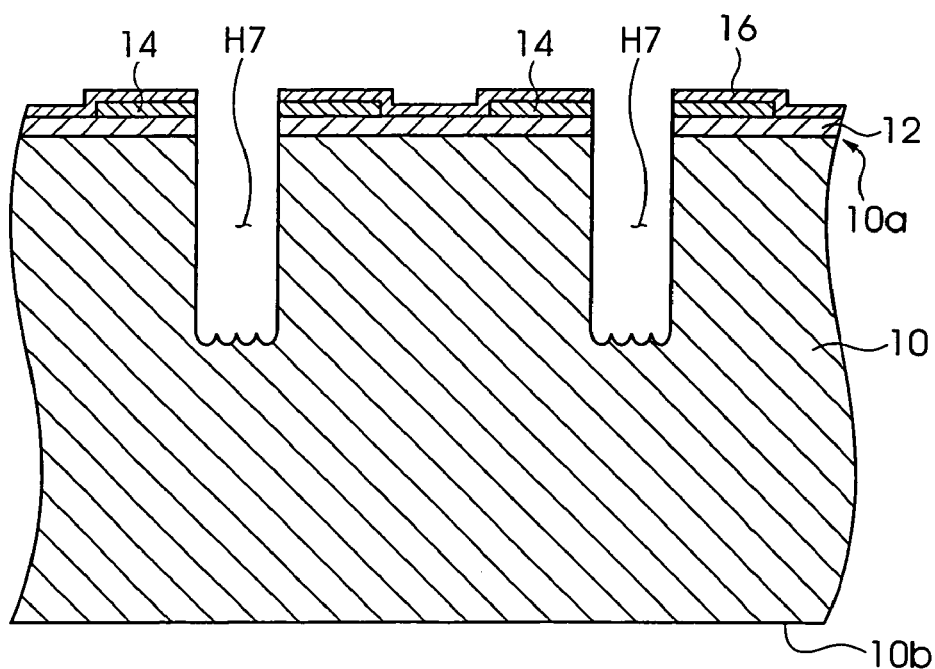
Figure 15A:
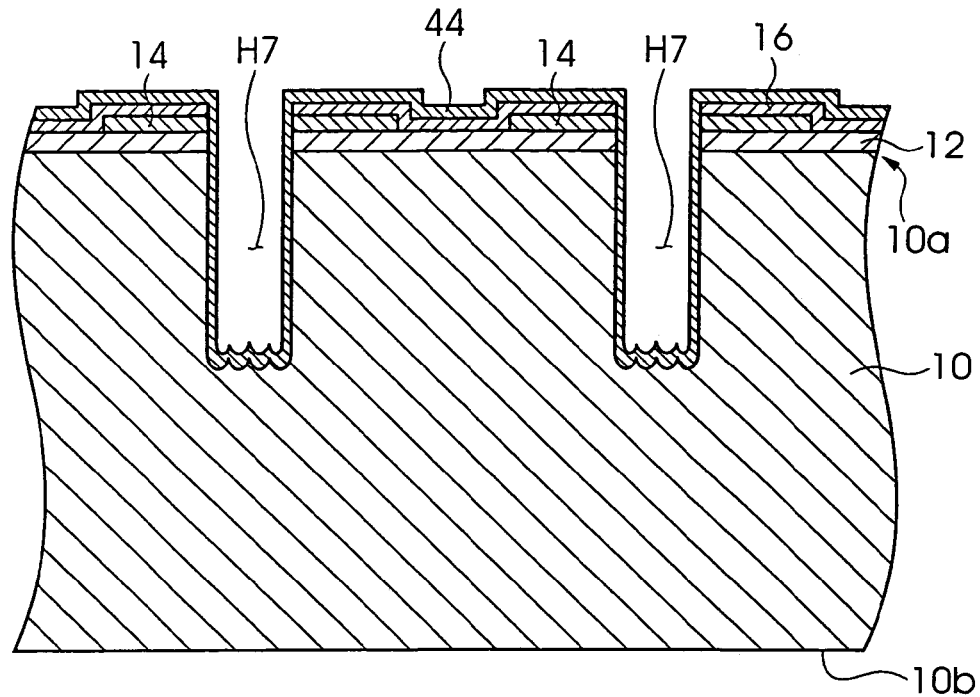
FIG. 15A and FIG. 15B are process drawings showing the manufacturing method for a semiconductor device according to a third embodiment of the present invention.

When the steps described above have been completed, next, the insulating film 40 formed on the passivation film 16 and the like is removed. FIG. 14B is a cross-sectional drawing of the step illustrating the state in which the insulating film 40 formed on the passivation film 16 and the like has been removed. Next, the insulating film 44 is formed on the passivation film 16 and the inner wall and bottom surface of the hole portion H7 (insulating film formation step). FIG. 15A is a cross-sectional drawing showing the state in which the insulating film 44 has been formed on the passivation film 16 and the inner walls and bottom surface of the hole portion H7. This insulating film 44, like the insulating film 18 formed in the first embodiment, is provided in order to prevent corrosion and the like of the substrate 10 due, for example, to oxygen and water, and is formed using a method identical to that in the first embodiment.

Next, a resist (not illustrated) is applied over the entire surface of the insulating film 44 using a method such as a spin coat method, dipping method, spray coat method or the like. Note that this resist is used for opening the area above a part of an electrode pad 14, and can be a photoresist, an electron beam resist, or an X-ray resist, and can be either a positive or negative resist.

When the resist has been applied to the insulating film 44, after prebaking has been carried out, an exposure treatment and a developing treatment are carried out using a mask on which a predetermined pattern has been formed, and the resist is patterned into a shape in which the resist remains only in parts other then the electrode pad 14 and the hole portion H8 and the area in proximity thereto. This shape may be, for example, a circular shape centered on the hole portion H7. When the patterning of the resist has been completed, after carrying out postbaking, the insulating film 44 and the passivation film 16 that cover a part of the electrode pad 14 is removed, and a part of the electrode pad 14 is opened.

Figure 15B:
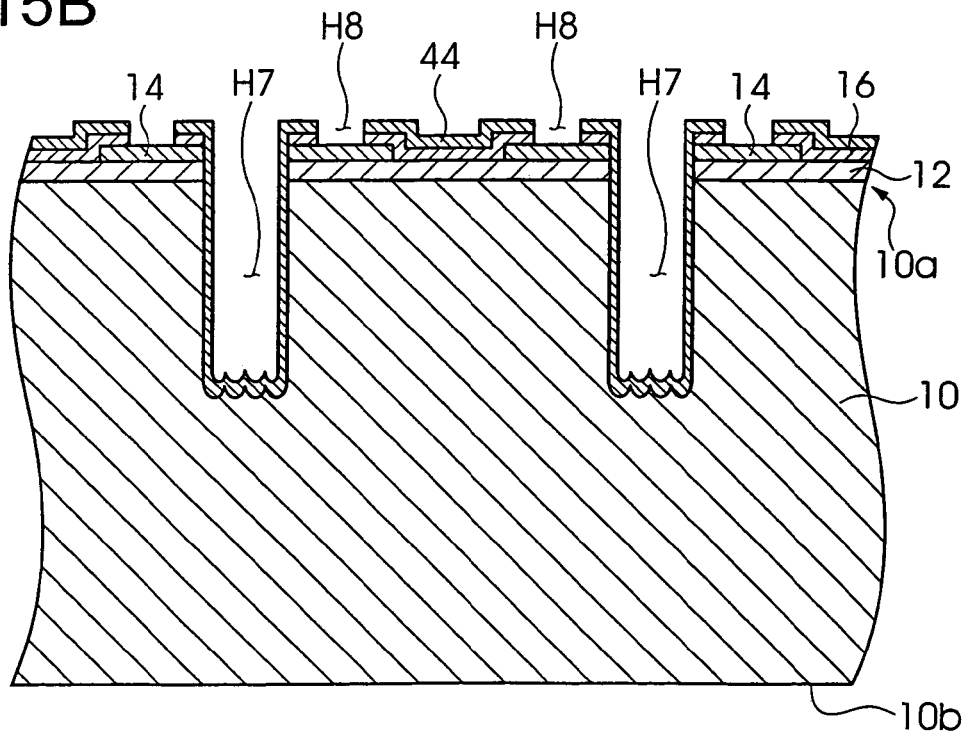

FIG. 15B is a cross-sectional drawing showing the state in which a part of the insulating film 44 and the passivation film 16 has been removed. As shown in FIG. 15B, the area above an electrode pad 14 becomes the opening portion H8, and a part of the electrode pad 14 is exposed. Due to this opening portion H8, it is possible to connect the connecting terminals 46 formed in a later step to the electrode pads 14. Therefore, the opening portion H8 can be formed at sites besides the sites at which the hole portions H7 have been formed, or in proximity thereto. In addition, like the first embodiment, preferably in consideration of making the connection resistance between the connecting terminals formed later and the electrode pads 14 small, the exposed area of the electrode pads 14 is made large. Note that when the insulating film 44 and the passivation film 16 that cover the electrode pads 14 is removed and a part of the electrode pads 14 is exposed, the resist used during this removal is stripped by a stripping liquid.

When the steps described above have been completed, next a step is carried out in which an undercoat film is formed. Note that this step and the undercoat film are not illustrated. The formation method of the undercoat film is identical to that in the first embodiment, and thus its explanation is omitted here. When the formation of the undercoat film has completed, a plating resist is applied on the active surface 10a of the substrate 10, and the plating resist pattern (not illustrated) is formed by carrying out patterning so that only the parts that form the connecting terminals 46 are opened. Subsequently, Cu (copper) is buried in the opening portion H7 of the substrate 10 and the opening of the plating resist pattern by carrying out Cu electrolytic plating, and thereby the connecting terminals 46 are formed (connecting terminal formation step).

Figure 16A:
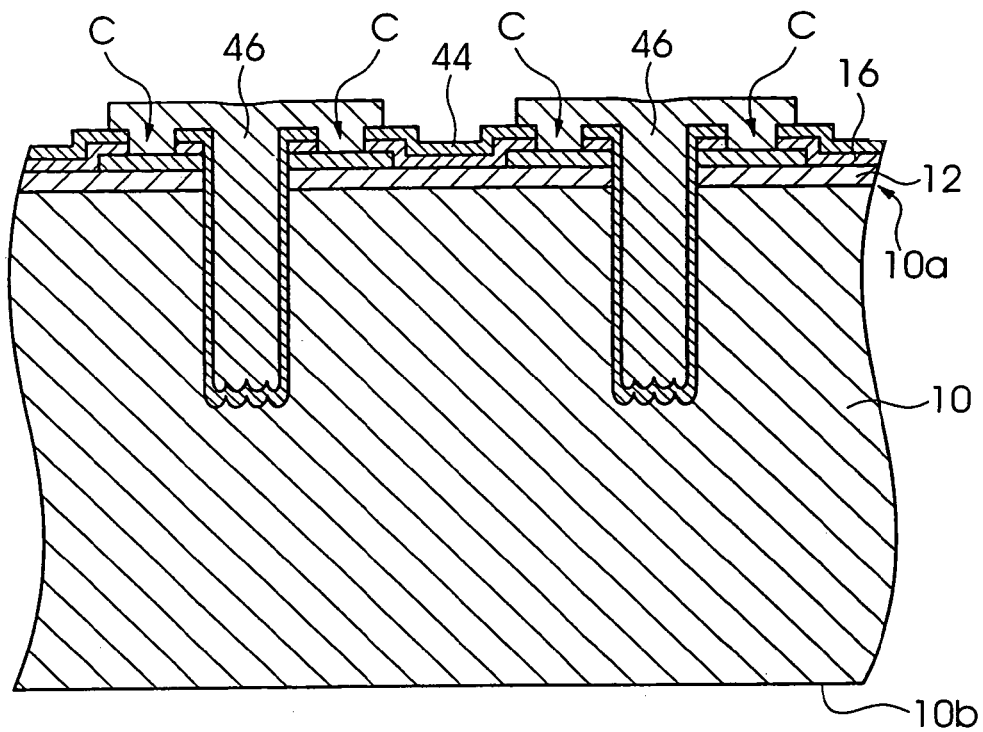
FIG. 16A to FIG. 16C are process drawings showing the manufacturing method for a semiconductor device according to a third embodiment of the present invention.

FIG. 16A is a cross-sectional drawing showing the state in which the connecting terminals 46 have been formed by Cu electrolytic plating. As shown in FIG. 16A, the connecting terminals 46 have a projecting form that projects through the active surface 10*a* of the substrate 10, and a part thereof has a shape that has been buried in the substrate 10. In addition, at the location denoted by reference letter C, the connecting terminals 46 are electrically connected to the electrode pads 14. When the connecting terminals 46 have been formed, the plating resist pattern formed on the substrate 10 is stripped.

When the steps described above have been completed, a step is carried out in which the substrate 10 is thinned by carrying out processing on the back surface 10*b* of the substrate 10, and the connecting terminals 46 formed buried in the substrate 10 are exposed (exposure step). Like the first embodiment, the processing method carried out on the back surface 10*b* of the substrate 10 for thinning the substrate 10 can use an etching method consisting of the first etching step through the third etching step. Note that instead of the first etching step, it is also possible to use a back surface grinding step.

Figure 16B:
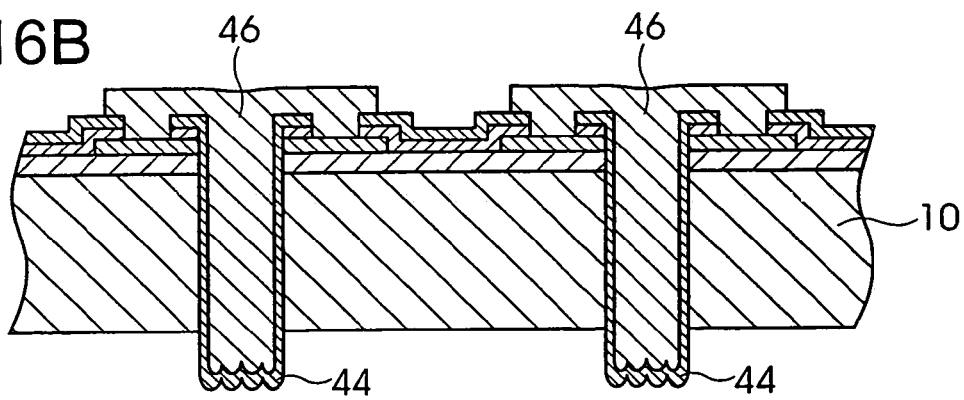

Etching of the back surface 10*b* of the substrate 10 (the first etching step and the second etching step) is carried out until the thickness of the substrate 10 is approximately 50 µm and the amount of the projection of the connecting terminals 46 from the back surface 10*b* of the substrate 10 attains a predetermined amount (for example, 20 µm). FIG. 16B is a cross-sectional drawing showing the state in which the second etching step has been carried out on the substrate 10. As shown in FIG. 16B, because the connecting terminals 46 themselves are covered by the insulating film 44 and the like without being exposed, a step is carried out in which a part of the insulating film 44 is removed by using the third etching step.

Figure 16C:
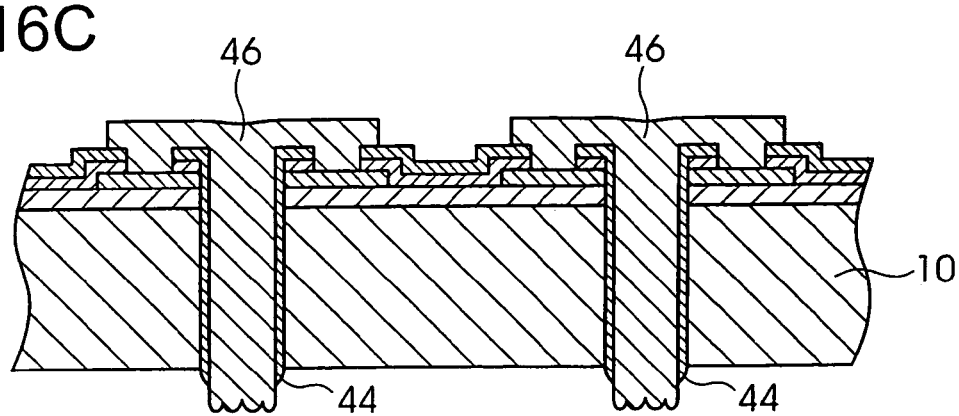

FIG. 16C is a cross-sectional drawing showing the state in which the insulating film 44 and the undercoat film have been etched. As shown in FIG. 16C, a part of the connecting terminals 46 projects from the back surface of the thinned substrate 10. In addition, when the connecting terminals 46 are exposed from the back surface of the substrate 10 by the first etching step through the third etching step described above, it can be understood that the shape of the exposed connecting terminals 46 is not changed, and is a shape that approximately conforms to the concavo-convex shape formed at the bottom surface of the hole portion H7.

When the steps described above have been completed, a lead free solder (Sn/Ag) is formed on either of the distal ends of a connecting terminal 46. Note that the lead free solder is not illustrated. When the formation of the lead free solder has completed, the substrate 10 in the wafer state is diced and the individual semiconductor chips are separated (the dicing step). Here, the dicing of the substrate 10 is carried out along the street lines (scribe lines) cut into the substrate 10 in advance.

Next, each of the separated semiconductor chips is stacked to produce the three-dimensional packaging structure (stacking step). To stack the semiconductor chips, first a step is carried out in which a bonding activator (flax) is applied onto the lead free solder that has been applied to a connecting terminal 46 formed in the semiconductor chip. When the semiconductor chips are stacked together, this flax holds the semiconductor chip due to its adhesive force so that the misalignment of the stacked semiconductor chips does not occur. At the same time, it also strips the oxygen film on the surface of the connecting terminals 46 that have been formed on the semiconductor chip.

Figure 17:
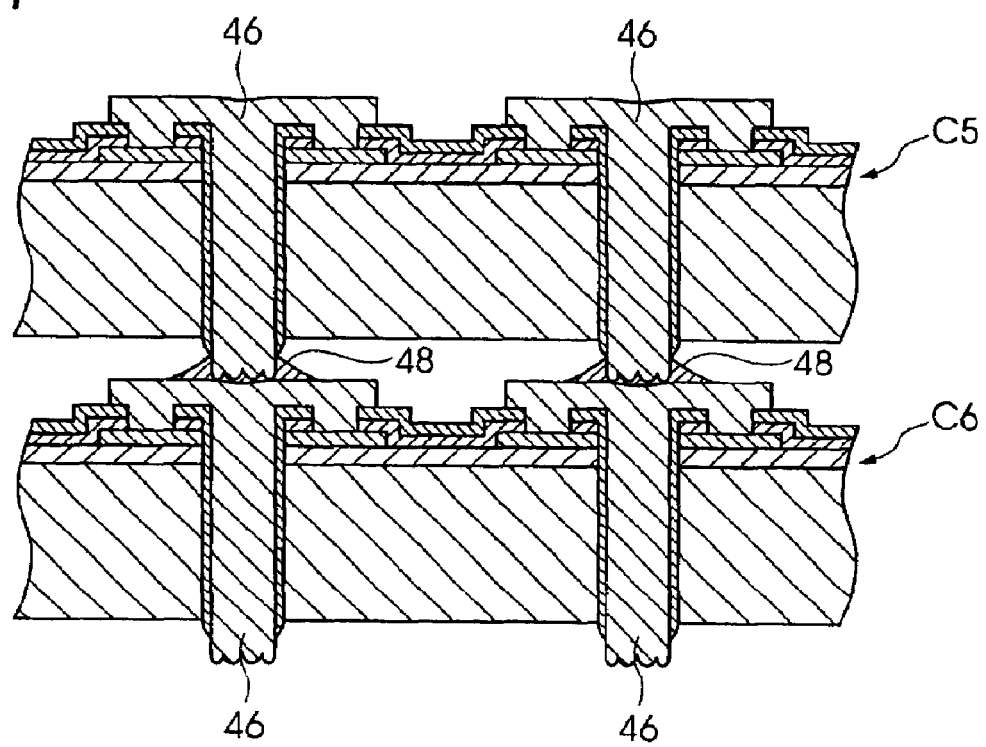
FIG. 17 is a process drawing showing the manufacturing method for a semiconductor device according to a third embodiment of the present invention.

When the application of the flax has been completed, as shown in FIG. 17, the semiconductor chip C5 and the semiconductor chip C6 are aligned such that the position of each of the connecting terminals 46 formed on the semiconductor chips are aligned, and the semiconductor chip C5 is stacked on semiconductor chip C6. Here, the stacked semiconductor chips can be the same type (that is, the electric circuits formed on the substrate are the same), or can be different types (that is, the electric circuits formed on the substrate are different).

When the steps described above are completed, the stacked semiconductor chips C5 and C6 are disposed in a reflow apparatus, the lead free solders provided on the distal ends of the connecting terminals 46 formed on the semiconductor chips C5 and C6 are melted, and the connecting terminals 20 formed on the semiconductor chip C5 and the connecting terminals 46 formed on the semiconductor chip C6 are bonded (bonding step). As shown in FIG. 17, the distal ends of the connecting terminals 46 formed on the semiconductor chip C5 on the back surface side (the semiconductor chip C6 side) have a curved surface, the bonding strength increases because the bonding area of the lead free solder 48 is large, and thereby it is possible to implement an improvement of the reliability.

Moreover, as shown in FIG. 17, an explanation was given above of an example of the case in which the semiconductor chip C5 and the semiconductor chip C6 are stacked, but like the first embodiment, the semiconductor chips obtained by dicing the substrate 10 can be mounted on a mounting substrate such as an interposer or mounted on a substrate processed using W-CSP technology.

(Electronic Apparatus)

Figure 18:
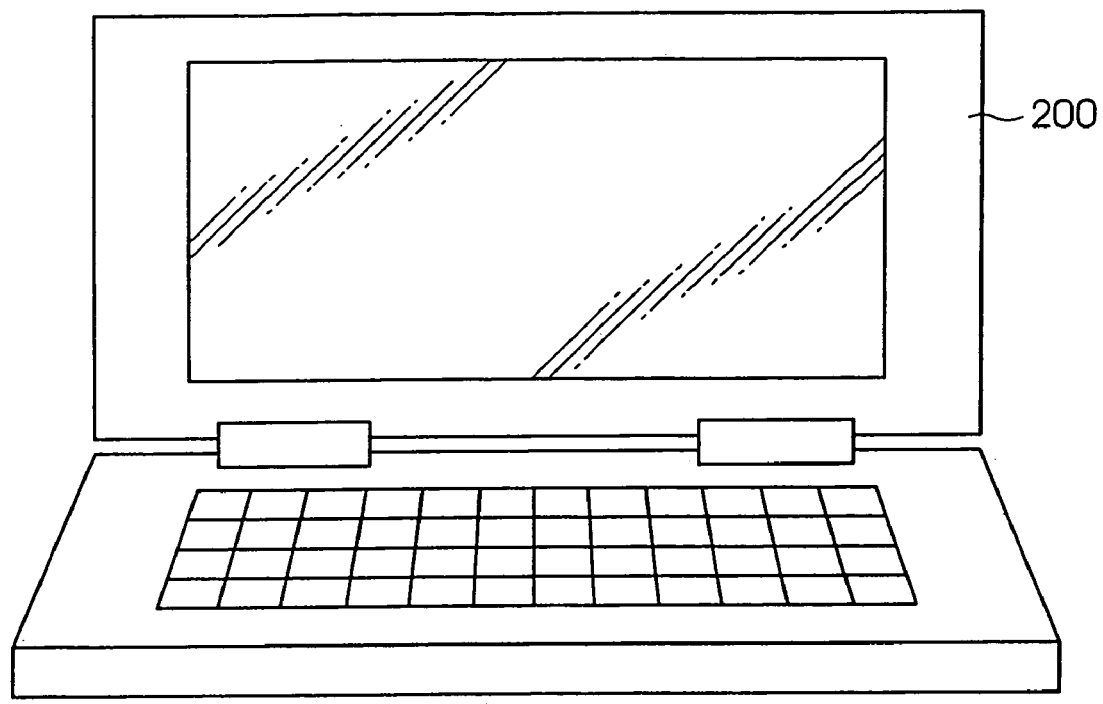
FIG. 18 is a drawing showing an example of an electronic apparatus according to the embodiments of the present invention.
Figure 19:
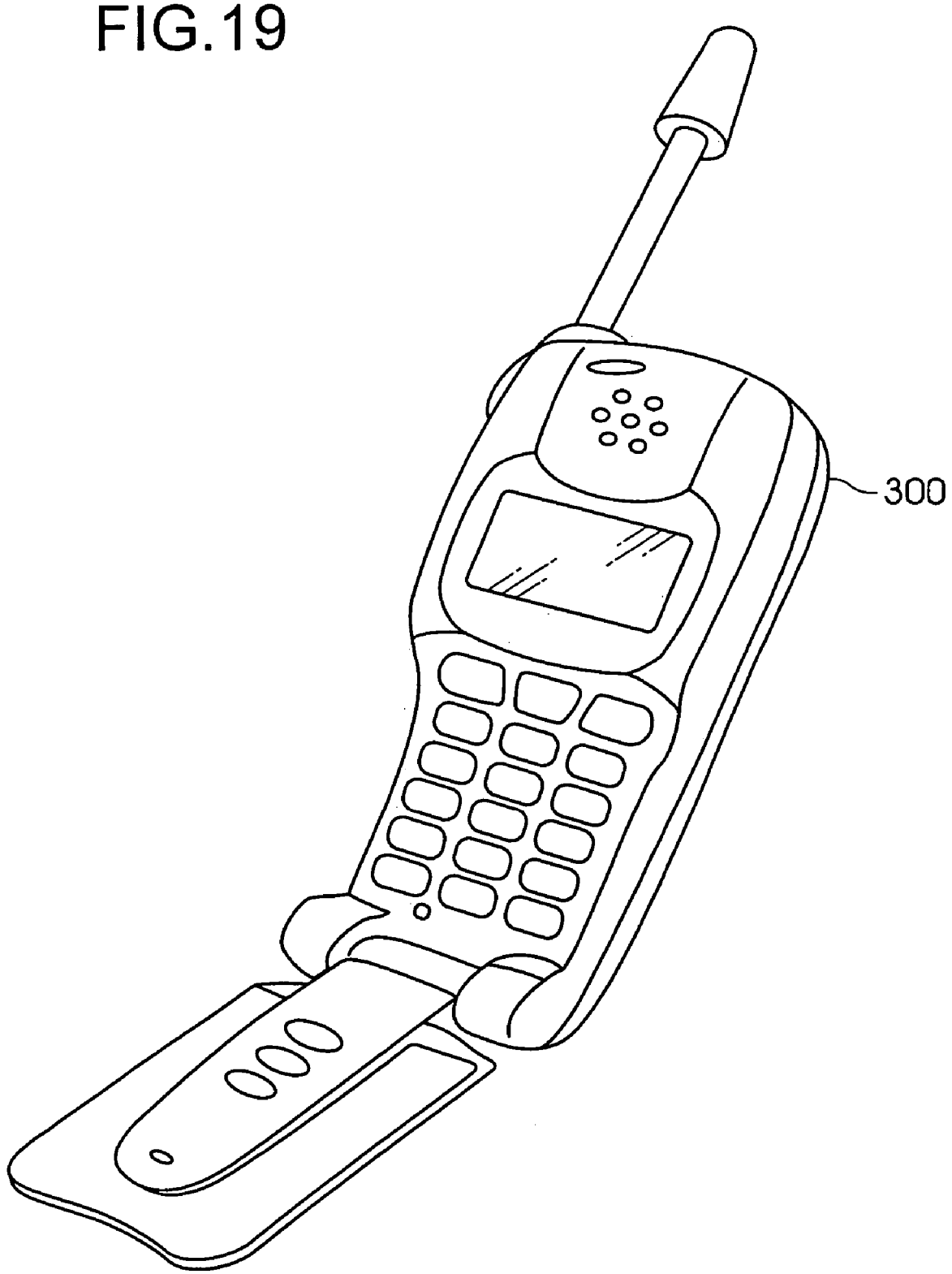
FIG. 19 is a drawing showing another example of an electronic apparatus according to the embodiments of the present invention.

The notebook-type personal computer 200 shown in FIG. 18 and the portable telephone 300 shown in FIG. 19 are provided as illustrations of the electronic apparatus having the semiconductor device according to the embodiments of the present invention. The semiconductor device is disposed inside the casing of each of the electronic apparatus. In addition, the electronic apparatus is not limited to the notebook-type personal computer or the portable telephone cited here, but can be applied to various types of electronic apparatus. For example, it is possible to apply it to electronic apparatus such as liquid crystals projectors, multimedia compatible personal computers (PC) and engineering workstations (EWS), pagers, word processors, televisions, view finder type or direct monitor viewing type video recorders, electronic assistants, electronic calculators, navigation devices, POS terminals, and apparatuses that provide touch panels.

Above, embodiments and other embodiments of the present invention have been explained. However, the present invention is not limited by these embodiments, and the present invention may be freely altered without departing from the spirit thereof. For example, in the embodiments described above, the semiconductor chops were mounted on a mounting substrate using a lead free solder, and the semiconductor chips were bonded together. However, instead of a lead free solder, they can be bonded using a metal bond.

What is claimed is:

1. A semiconductor device comprising:
   a thinned substrate having an active surface side on which electronic circuits are formed and a back surface side opposite the active surface side; and
   connecting terminals that serve as external electrodes for the electronic circuits, the connecting terminals passing through the substrate from the active surface side to the back surface side;
   wherein distal ends of the connecting terminals at the back surface side of the substrate have a plurality of surface undulations which comprise one of:

a plurality of convex outward surfaces; and a plurality of concave inward surfaces, and wherein the connecting terminals respectively include a first part and a second part, the first part being directly connected to the electronic circuits, the second part passing through the substrate, the first part and the second part consisting of the same metal and forming a unit.

2. A semiconductor device wherein the semiconductor device according to claim 1 are stacked in plurality and the second parts of one and another of the connecting terminals are bonded together in a line.

3. A semiconductor device comprising:

a mounting substrate on which a connection part is formed; and one or a plurality of a semiconductor device according to claim 1 are mounted on the mounting substrate;

wherein the connecting terminals are bonded together or the connecting portion and the connecting terminals are bonded together.

4. An electronic apparatus comprising the semiconductor device according to claim 1.

* * * * *